(12) United States Patent
Dun

(10) Patent No.: US 10,175,925 B2
(45) Date of Patent: Jan. 8, 2019

(54) BI-DIRECTIONAL SCANNING UNIT, DRIVING METHOD AND GATE DRIVING CIRCUIT

(71) Applicants: SHANGHAI AVIC OPTO ELECTRONICS CO., LTD, Shanghai (CN); TIANMA MICRO-ELECTRONICS CO., LTD., Shenzhen (CN)

(72) Inventor: Dongliang Dun, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 254 days.

(21) Appl. No.: 15/352,562

(22) Filed: Nov. 15, 2016

(65) Prior Publication Data
US 2017/0061861 A1    Mar. 2, 2017

(30) Foreign Application Priority Data
Jul. 29, 2016   (CN) .......................... 2016 1 0615275

(51) Int. Cl.
*G11C 19/00*   (2006.01)
*G06F 3/14*    (2006.01)
(Continued)

(52) U.S. Cl.
CPC ............ *G06F 3/1446* (2013.01); *G11C 19/28* (2013.01); *G09G 3/3677* (2013.01); *G09G 2300/026* (2013.01); *G09G 2310/0267* (2013.01); *G09G 2310/0283* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 9,196,211 B2 * 11/2015 Hu ....................... G09G 3/3696
2009/0167668 A1 * 7/2009 Kim .................... G09G 3/3677
                                                               345/100

(Continued)

FOREIGN PATENT DOCUMENTS

CN            103310755 B      1/2016

*Primary Examiner* — Tuan T Lam
(74) *Attorney, Agent, or Firm* — Kilpatrick Townsend & Stockton LLP

(57) ABSTRACT

A bi-directional scanning unit, a driving method and a gate driving circuit are provided. The bi-directional scanning unit includes a first stage subunit and a second stage subunit. The bi-directional scanning unit outputs a scanning signal stage by stage in a direction from the first stage subunit to the second stage subunit and outputs a scanning signal stage by stage in a direction from the second stage subunit to the first stage subunit. During the scanning, the first stage subunit and the second stage subunit cooperate with each other, so that one of the stage subunits does not output a scanning signal while the other one outputs a scanning signal. With the technical solutions according to the embodiments, the bi-directional scanning unit can output two-stage scanning signals stage by stage, have a simplified structure, and satisfy diverse demands on the gate driving circuit.

18 Claims, 7 Drawing Sheets

(51) Int. Cl.
*G11C 19/28* (2006.01)
*G09G 3/36* (2006.01)

(56) References Cited

U.S. PATENT DOCUMENTS

| | | | | |
|---|---|---|---|---|
| 2009/0256794 A1* | 10/2009 | Jang | ........................ | G11C 19/28 |
| | | | | 345/100 |
| 2011/0002438 A1* | 1/2011 | Kim | ........................ | G11C 19/28 |
| | | | | 377/67 |
| 2011/0273417 A1* | 11/2011 | Shin | ........................ | G09G 3/20 |
| | | | | 345/211 |
| 2016/0351156 A1* | 12/2016 | Wu | ........................ | G11C 19/28 |
| 2017/0061862 A1* | 3/2017 | Dun | ........................ | G06F 3/1446 |
| 2017/0193950 A1* | 7/2017 | Kim | ..................... | G09G 3/3677 |

* cited by examiner

BI-DIRECTIONAL SCANNING UNIT, DRIVING METHOD AND GATE DRIVING CIRCUIT

CROSS REFERENCE OF RELATED APPLICATION

This application claims the priority to Chinese Patent Application No. 201610615275.5, entitled "BI-DIRECTIONAL SCANNING UNIT, DRIVING METHOD AND GATE DRIVING CIRCUIT", filed with the Chinese State Intellectual Property Office on Jul. 29, 2016, which is incorporated by reference in its entirety herein.

TECHNICAL FIELD

The present disclosure relates to the field of display technology, and in particular to a bi-directional scanning unit, a driving method and a gate driving circuit.

BACKGROUND

With the development of the electronic technology, display devices, such as televisions, mobile phones, computers and personal digital assistants, have been widely used in various fields and electronic products and have been an indispensable part for people's life and work. An conventional display device includes a gate driving circuit which is mainly used to scan multiple stages of gate lines to scan pixel arrays electrically connected to the gate lines and then to display a picture in coordination with other line structures. For diverse demands on a gate driving circuit, designing of the gate driving circuit has become one of main research trends for developers nowadays.

SUMMARY

In view of the above, a bi-directional scanning unit, a driving method and a gate driving circuit are provided according to the present disclosure. The bi-directional scanning unit can output two-stage scanning signals stage by stage, have a simplified structure due to an interaction between a first stage subunit and a second stage subunit, and satisfy diverse demands on the gate driving circuit.

In order to achieve the above object, the following technical solutions are provided by the present disclosure.

A bi-directional scanning unit is provided by the present disclosure, which includes a first stage subunit and a second stage subunit. The first stage subunit includes a first input module, a first pull-up node, a first pull-up control module, a second pull-up control module, a first pull-down node, a first pull-down control module, a second pull-down control module, a first pull-down generation module, a first output module, a first output terminal, a first cascade output module and a first cascade output terminal. The second stage subunit includes a second input module, a second pull-up node, a third pull-up control module, a fourth pull-up control module, a second pull-down node, a third pull-down control module, a fourth pull-down control module, a second pull-down generation module, a second output module, a second output terminal, a second cascade output module and a second cascade output terminal.

The first input module controls, in response to a signal of a first control terminal, a connection state between a first voltage terminal and the first pull-up node and a connection state between a fourth voltage terminal and the first output terminal, and controls, in response to a signal of a second control terminal, a connection state between a second voltage terminal and the first pull-up node and a connection state between a fourth voltage terminal and the first output terminal, where a level of a signal outputted by the first voltage terminal is opposite to that outputted by the second voltage terminal.

The second input module controls, in response to a signal of a third control terminal, a connection state between the first voltage terminal and the second pull-up node and a connection state between the fourth voltage terminal and the second output terminal, or controls, in response to a signal of a fourth control terminal, a connection state between the second voltage terminal and the second pull-up node and a connection state between the fourth voltage terminal and the second output terminal, where a structure of the first input module is the same as that of the second input module.

The first pull-up control module controls, in response to a signal of the first pull-up node, a connection state between the first pull-down node and a third voltage terminal and a connection state between the first pull-down node and the first pull-down generation module; and the second pull-up control module controls, in response to a signal of the second pull-up node, a connection state between the first pull-down node and the third voltage terminal and a connection state between the first pull-down node and the first pull-down generation module, where an output voltage of the third voltage terminal is lower than that of the fourth voltage terminal.

The third pull-up control module controls, in response to the signal of the second pull-up node, a connection state between the second pull-down node and the third voltage terminal and a connection state between the second pull-down node and the second pull-down generation module; and the fourth pull-up control module controls, in response to the signal of the first pull-up node, a connection state between the second pull-down node and the third voltage terminal and a connection state between the second pull-down node and the second pull-down generation module, where a structure of the first pull-up control module is the same as that of the third pull-up control module, and a structure of the second pull-up control module is the same as that of the fourth pull-up control module.

The first pull-down generation module controls, in response to a signal of a first signal terminal, a connection state between the first signal terminal and the first pull-down node.

The second pull-down generation module controls, in response to a signal of a second signal terminal, a connection state between the second signal terminal and the second pull-down node, where a structure of the first pull-down generation module is the same as that of the second pull-down generation module.

The first pull-down control module controls, in response to a signal of the first pull-down node, a connection state between the first pull-up node and the third voltage terminal and a connection state between the fourth voltage terminal and the first output terminal; and the second pull-down control module controls, in response to a signal of the second pull-down node, a connection state between the first pull-up node and the third voltage terminal and a connection state between the fourth voltage terminal and the first output terminal.

The third pull-down control module controls, in response to the signal of the second pull-down node, a connection state between the second pull-up node and the third voltage terminal and a connection state between the fourth voltage terminal and the second output terminal; and the fourth pull-down control module controls, in response to the signal of the first pull-down node, a connection state between the second pull-up node and the third voltage terminal and a connection state between the fourth voltage terminal and the second output terminal, where a structure of the first pull-down control module is the same as that of the third pull-down control module, and a structure of the second pull-down control module is the same as that of the fourth pull-down control module.

The first output module controls, in response to the signal of the first pull-up node, a connection state between a first clock signal terminal and the first output terminal, and the second output module controls, in response to the signal of the second pull-up node, a connection state between a second clock signal terminal and the second output terminal, where a phase difference of signals outputted by the first clock signal terminal and the second clock signal terminal is 180 degree, and a structure of the first output module is the same as that of the second output module.

The first cascade output module controls, in response to the signal of the first pull-down node or the second pull-down node, a connection state between the third voltage terminal and the first cascade output terminal, and controls, in response to the signal of the first pull-up node, a connection state between the first clock signal terminal and the first cascade output terminal.

The second cascade output module controls, in response to the signal of the second pull-down node or the first pull-down node, a connection state between the third voltage terminal and the second cascade output terminal, and controls, in response to the signal of the second pull-up node, a connection state between the second clock signal terminal and the second cascade output terminal, where a structure of the first cascade output module is the same as that of the second cascade output module.

A driving method is further provided, which is applied to the bi-directional scanning unit according to any one of above solutions. The driving method includes a first stage, a second stage, a third stage and a fourth stage.

When scanning in a direction from the first stage subunit to the second stage subunit, in the first stage, the first input module controls, in response to a signal of the first control terminal, an activation of a connection between the first voltage terminal and the first pull-up node, and an activation of a connection between the fourth voltage terminal and the first output terminal; the first pull-up control module controls, in response to a signal of the first pull-up node, a deactivation of a connection between the first pull-down node and the third voltage terminal, and a deactivation of a connection between the first pull-down node and the first pull-down generation module, and the fourth pull-up control module controls, in response to the signal of the first pull-up node, an activation of a connection between the second pull-down node and the third voltage terminal, and a deactivation of a connection between the second pull-down node and the second pull-down generation module; the first output module controls, in response to the signal of the first pull-up node, an activation of a connection between the first clock signal terminal and the first output terminal; and the first cascade output module controls, in response to the signal of the first pull-up node, an activation of a connection between the first clock signal terminal and the first cascade output terminal.

In the second stage, the first output module controls, in response to the signal of the first pull-up node, an activation of a connection between the first clock signal terminal and the first output terminal, and the first cascade output module controls, in response to the signal of the first pull-up node, an activation of a connection between the first clock signal terminal and the first cascade output terminal, with an output signal of the first clock signal terminal being a scanning signal; the second input module controls, in response to a signal of the third control terminal, an activation of a connection between the first voltage terminal and the second pull-up node, and an activation of a connection between the fourth voltage terminal and the second output terminal; the first pull-up control module controls, in response to the signal of the first pull-up node, an activation of a connection between the first pull-down node and the third voltage terminal, and an activation of a connection between the first pull-down node and the first pull-down generation module; the second pull-up control module controls, in response to a signal of the second pull-up node, an activation of a connection between the first pull-down node and the third voltage terminal, and a deactivation of a connection between the first pull-down node and the first pull-down generation module; the third pull-up control module controls, in response to the signal of the second pull-up node, an activation of a connection between the second pull-down node and the third voltage terminal, and a deactivation of a connection between the second pull-down node and the second pull-down generation module; the fourth pull-up control module controls, in response to the signal of the first pull-up node, an activation of a connection between the second pull-down node and the third voltage terminal, and a deactivation of a connection between the second pull-down node and the second pull-down generation module; the second output module controls, in response to the signal of the second pull-up node, an activation of a connection between the second clock signal terminal and the second output terminal; and the second cascade output module controls, in response to the signal of the second pull-up node, an activation of a connection between the second clock signal terminal and the second cascade output terminal.

In the third stage, the second output module controls, in response to the signal of the second pull-up node, an activation of a connection between the second clock signal terminal and the second output terminal, and the second cascade output module controls, in response to the signal of the second pull-up node, an activation of a connection between the second clock signal terminal and the second cascade output terminal, with an output signal of the second clock signal terminal being the scanning signal; the first input module controls, in response to a signal of the second control terminal, an activation of a connection between the second voltage terminal and the first pull-up node, and an activation of a connection between the fourth voltage terminal and the first output terminal; the third pull-up control module controls, in response to the signal of the second pull-up node, an activation of a connection between the second pull-down node and the third voltage terminal, and a deactivation of a connection between the second pull-down node and the second pull-down generation module; and the second pull-up control module controls, in response to the signal of the second pull-up node, an activation of a connection between the first pull-down node and the third voltage terminal, and a deactivation of a connection between the first pull-down node and the first pull-down generation module.

In the fourth stage, the second input module controls, in response to a signal of the fourth control terminal, an activation of a connection between the second voltage terminal and the second pull-up node, and an activation of a connection between the fourth voltage terminal and the second output terminal.

The first pull-down generation module controls, in response to a signal of the first signal terminal, an activation of a connection between the first signal terminal and the first pull-down node; the first pull-down control module controls, in response to a signal of the first pull-down node, an activation of a connection between the first pull-up node and the third voltage terminal, and an activation of a connection between the fourth voltage terminal and the first output terminal; the fourth pull-down control module controls, in response to the signal of the first pull-down node, an activation of a connection between the second pull-up node and the third voltage terminal, and an activation of a connection between the fourth voltage terminal and the second output terminal; the first cascade output module controls, in response to the signal of the first pull-down node, an activation of a connection between the third voltage terminal and the first cascade output terminal, and the second cascade output module controls, in response to the signal of the first pull-down node, an activation of a connection between the third voltage terminal and the second cascade output terminal; or where the second pull-down generation module controls, in response to a signal of the second signal terminal, an activation of a connection between the second signal terminal and the second pull-down node; the third pull-down control module controls, in response to a signal of the second pull-down node, an activation of a connection between the second pull-up node and the third voltage terminal, and an activation of a connection between the fourth voltage terminal and the second output terminal; the second pull-down control module controls, in response to the signal of the second pull-down node, an activation of a connection between the first pull-up node and the third voltage terminal, and an activation of a connection between the fourth voltage terminal and the first output terminal; and the first cascade output module controls, in response to the signal of the second pull-down node, an activation of a connection between the third voltage terminal and the first cascade output terminal, and the second cascade output module controls, in response to the signal of the second pull-down node, an activation of a connection between the third voltage terminal and the second cascade output terminal.

Or when scanning in a direction from the second stage subunit to the first stage subunit, in the first stage, the second input module controls, in response to a signal of the fourth control terminal, an activation of a connection between the second voltage terminal and the second pull-up node, and an activation of a connection between the fourth voltage terminal and the second output terminal; the third pull-up control module controls, in response to a signal of the second pull-up node, an activation of a connection between the second pull-down node and the third voltage terminal, and an activation of a connection between the second pull-down node and the second pull-down generation module; the second pull-up control module controls, in response to the signal of the second pull-up node, an activation of a connection between the first pull-down node and the third voltage terminal, and an activation of a connection between the first pull-down node and the first pull-down generation module; the second output module controls, in response to the signal of the second pull-up node, an activation of a connection between the second clock signal terminal and the second output terminal; and the second cascade output module controls, in response to the signal of the second pull-up node, an activation of a connection between the second clock signal terminal and the second cascade output terminal.

In the second stage, the second output module controls, in response to the signal of the second pull-up node, an activation of a connection between the second clock signal terminal and the second output terminal, and the second cascade output module controls, in response to the signal of the second pull-up node, an activation of a connection between the second clock signal terminal and the second cascade output terminal, with an output signal of the second clock signal terminal being a scanning signal; the first input module controls, in response to a signal of the second control terminal, an activation of a connection between the second voltage terminal and the first pull-up node, and an activation of a connection between the fourth voltage terminal and the first output terminal; the third pull-up control module controls, in response to the signal of the second pull-up node, an activation of a connection between the second pull-down node and the third voltage terminal, and an activation of a connection between the second pull-down node and the second pull-down generation module; and the second pull-up control module controls, in response to the signal of the second pull-up node, an activation of a connection between the first pull-down node and the third voltage terminal, and an activation of a connection between the first pull-down node and the first pull-down generation module; the second output module controls, in response to the signal of the second pull-up node, an activation of a connection between the second clock signal terminal and the second output terminal; the first pull-up control module controls, in response to a signal of the first pull-up node, an activation of a connection between the first pull-down node and the third voltage terminal, and a deactivation of a connection between the first pull-down node and the first pull-down generation module; the fourth pull-up control module controls, in response to the signal of the first pull-up node, an activation of a connection between the second pull-down node and the third voltage terminal, and a deactivation of a connection between the second pull-down node and the second pull-down generation module; the first output module controls, in response to the signal of the first pull-up node, an activation of a connection between the first clock signal terminal and the first output terminal; and the first cascade output module controls, in response to the signal of the first pull-up node, an activation of a connection between the first clock signal terminal and the first cascade output terminal.

In the third stage, the first output module controls, in response to the signal of the first pull-up node, an activation of a connection between the first clock signal terminal and the first output terminal, the first cascade output module controls, in response to the signal of the first pull-up node, an activation of a connection between the first clock signal terminal and the first cascade output terminal, with the output signal of the first clock signal terminal being the scanning signal; and the second input module controls, in response to a signal of the third control terminal, an activation of a connection between the first voltage terminal and the second pull-up node, and an activation of a connection between the fourth voltage terminal and the second output terminal; the first pull-up control module controls, in response to the signal of the first pull-up node, an activation of a connection between the first pull-down node and the third voltage terminal, and a deactivation of a connection between the first pull-down node and the first pull-down generation module; and the fourth pull-up control module controls, in response to the signal of the first pull-up node, an activation of a connection between the second pull-down node and the third voltage terminal, and a deactivation of a connection between the second pull-down node and the second pull-down generation module.

In the fourth stage, the first input module controls, in response to a signal of the first control terminal, an activation of a connection between the first voltage terminal and the first pull-up node, and an activation of a connection between the fourth voltage terminal and the first output terminal.

The first pull-down generation module controls, in response to a signal of the first signal terminal, an activation of a connection between the first signal terminal and the first pull-down node; and the first pull-down control module controls, in response to a signal of the first pull-down node, an activation of a connection between the first pull-up node and the third voltage terminal, and an activation of a connection between the fourth voltage terminal and the first output terminal; the fourth pull-down control module controls, in response to the signal of the first pull-down node, an activation of a connection between the second pull-up node and the third voltage terminal, and an activation of a connection between the fourth voltage terminal and the second output terminal; the first cascade output module controls, in response to the signal of the first pull-down node, an activation of a connection between the third voltage terminal and the first cascade output terminal, and the second cascade output module controls, in response to the signal of the first pull-down node, an activation of a connection between the third voltage terminal and the second cascade output terminal; or where the second pull-down generation module controls, in response to a signal of the second signal terminal, an activation of a connection between the second signal terminal and the second pull-down node; and the third pull-down control module controls, in response to a signal of the second pull-down node, an activation of a connection between the second pull-up node and the third voltage terminal, and an activation of a connection between the fourth voltage terminal and the second output terminal; the second pull-down control module controls, in response to the signal of the second pull-down node, an activation of a connection between the first pull-up node and the third voltage terminal, and an activation of a connection between the fourth voltage terminal and the first output terminal; and the first cascade output module controls, in response to the signal of the second pull-down node, an activation of a connection between the third voltage terminal and the first cascade output terminal, and the second cascade output module controls, in response to the signal of the second pull-down node, an activation of a connection between the third voltage terminal and the second cascade output terminal.

A gate driving circuit is provided, which includes n stages of bi-directional scanning units, which include a first stage bi-directional scanning unit through an n-th stage bi-directional scanning unit. Each stage of bi-directional scanning unit is the bi-directional scanning unit according to any one of the above solutions, where n is an integer not smaller than 2.

Compared with the conventional technology, the technical solutions according to the present disclosure have at least the following advantages.

A bi-directional scanning unit, a driving method and a gate driving circuit are provided according to the present disclosure. The bi-directional scanning unit includes a first stage subunit and a second stage subunit. The bi-directional scanning unit can output scanning signals stage by stage in a direction from the first stage subunit to the second stage subunit, and can also output scanning signals stage by stage in a direction from the second stage subunit to the first stage subunit. During the scanning, the first stage subunit and the second stage subunit cooperate with each other, so that one of the stage subunits does not output a scanning signal while the other one outputs a scanning signal. With the technical solutions according to the present disclosure, the bi-directional scanning unit can output two-stage scanning signals stage by stage, have a simplified structure due to an interaction between the first stage subunit and the second stage subunit, and satisfy diverse demands on the gate driving circuit.

BRIEF DESCRIPTION OF THE DRAWINGS

To illustrate technical solutions according to the embodiments of the invention or in the conventional technologies more clearly, drawings to be used in the descriptions of the embodiments or the conventional technologies are described briefly hereinafter. Obviously, the drawings described hereinafter are only for some embodiments of the invention, and other drawings may be obtained by those skilled in the art based on those drawings without creative efforts.

DETAILED DESCRIPTION OF THE EMBODIMENTS

Technical solutions in embodiments of the invention are described clearly and completely hereinafter in conjunction with the drawings in the embodiments of the invention. Obviously, the described embodiments are only a part rather than all of the embodiments of the invention. All the other embodiments obtained by those skilled in the art without creative effort on the basis of the embodiments of the invention fall within the scope of protection of the present disclosure.

As described in the background, for diverse demands on a gate driving circuit, design of a gate driving circuit has become one of main research trends for developers nowadays.

With this, a bi-directional scanning unit, a driving method and a gate driving circuit are provided according to the embodiments. The bi-directional scanning unit can output two-stage scanning signals stage by stage, have a simplified structure due to an interaction between the first stage subunit and the second stage subunit, and satisfy diverse demands on the gate driving circuit. To achieve the above object, the following technical solutions are provided according to the embodiments, and the technical solutions according to the embodiments are described in detail specifically in conjunction with FIG. 1 to FIG. 6.

Figure 1:
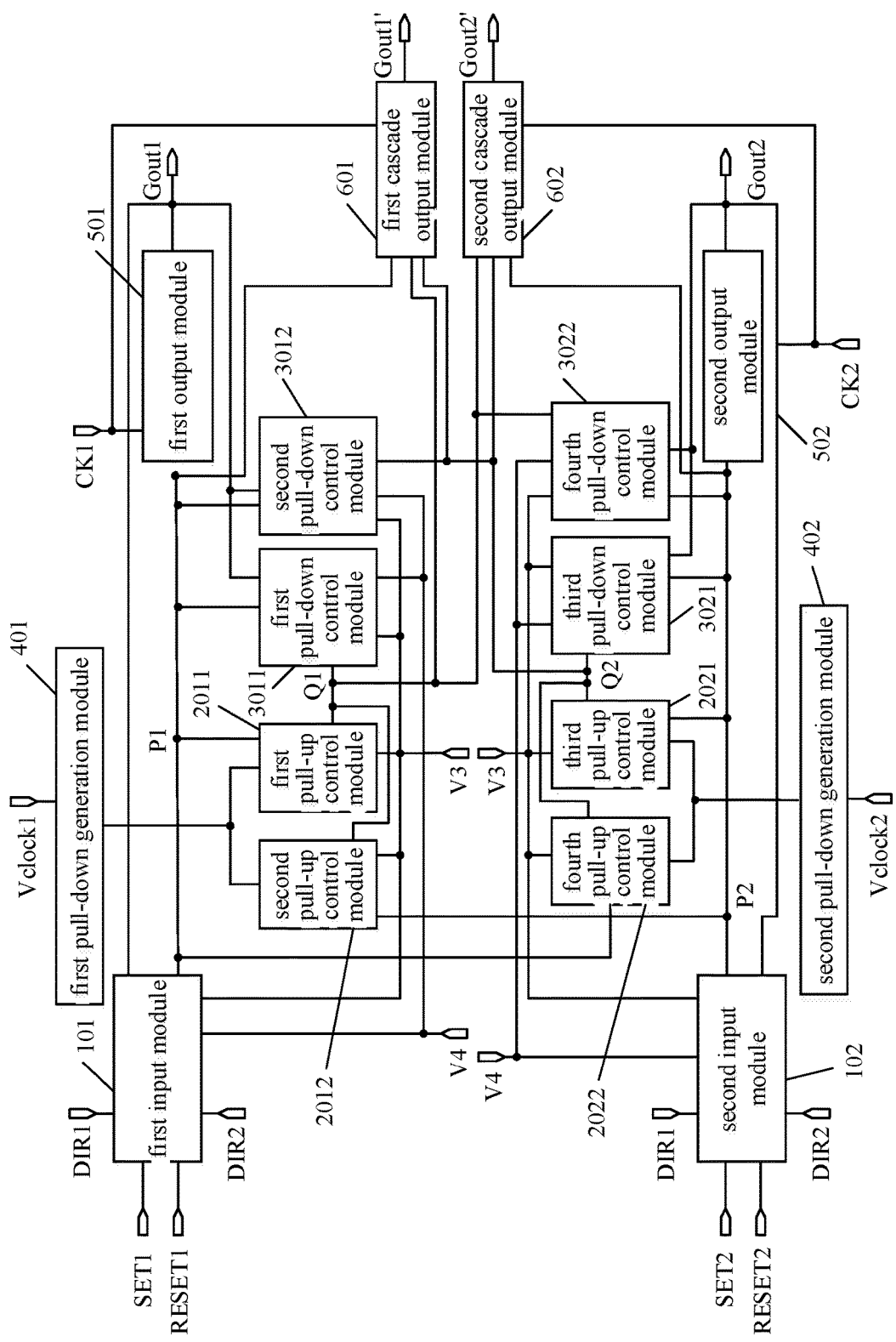
FIG. 1 is a schematic structural diagram of a bi-directional scanning unit according to an embodiment of the invention.

Reference is made to FIG. 1, which is a schematic structural diagram of a bi-directional scanning unit according to an embodiment. The bi-directional scanning unit is applied to a gate driving circuit. The bi-directional scanning unit includes a first stage subunit and a second stage subunit.

The first stage subunit includes a first input module 101, a first pull-up node P1, a first pull-up control module 2011, a second pull-up control module 2012, a first pull-down node Q1, a first pull-down control module 3011, a second pull-down control module 3012, a first pull-down generation module 401, a first output module 501, a first output terminal Gout1, a first cascade output module 601 and a first cascade output terminal Gout1'. The second stage subunit includes a second input module 102, a second pull-up node P2, a third pull-up control module 2021, a fourth pull-up control module 2022, a second pull-down node Q2, a third pull-down control module 3021, a fourth pull-down control module 3022, a second pull-down generation module 402, a second output module 502, a second output terminal Gout2, a second cascade output module 602 and a second cascade output terminal Gout2'.

The first input module 101 controls, in response to a signal of a first control terminal SET1, a connection state between a first voltage terminal DIR1 and the first pull-up node P1 and a connection state between a fourth voltage terminal V4 and the first output terminal Gout1, and controls, in response to a signal of a second control terminal RESET1, a connection state between a second voltage terminal DIR2 and the first pull-up node P1 and a connection state between a fourth voltage terminal V4 and the first output terminal Gout1, where a level of a signal outputted by the first voltage terminal DIR1 is opposite to that outputted by the second voltage terminal DIR2.

The second input module 102 controls, in response to a signal of a third control terminal SET2, a connection state between the first voltage terminal DIR1 and the second pull-up node P2 and a connection state between the fourth voltage terminal V4 and the second output terminal Gout2. Alternatively, the second input module 102 controls, in response to a signal of a fourth control terminal RESET2, a connection state between the second voltage terminal DIR2 and the second pull-up node P2 and a connection state between the fourth voltage terminal V4 and the second output terminal Gout2, where a structure of the first input module 101 is the same as that of the second input module 102.

The first pull-up control module 2011 controls, in response to a signal of the first pull-up node P1, a connection state between the first pull-down node Q1 and a third voltage terminal V3 and a connection state between the first pull-down node Q1 and the first pull-down generation module 401. The second pull-up control module 2012 controls, in response to a signal of the second pull-up node P2, a connection state between the first pull-down node Q1 and the third voltage terminal V3 and a connection state between the first pull-down node Q1 and the first pull-down generation module 401. An output voltage of the third voltage terminal is lower than that of the fourth voltage terminal.

The third pull-up control module 2021 controls, in response to the signal of the second pull-up node P2, a connection state between the second pull-down node Q2 and the third voltage terminal V3 and a connection state between the second pull-down node Q2 and the second pull-down generation module 402. The fourth pull-up control module 2022 controls, in response to the signal of the first pull-up node P1, a connection state between the second pull-down node Q2 and the third voltage terminal V3 and a connection state between the second pull-down node Q2 and the second pull-down generation module 402, where a structure of the first pull-up control module 2011 is the same as that of the third pull-up control module 2021, and a structure of the second pull-up control module 2012 is the same as that of the fourth pull-up control module 2022.

The first pull-down generation module 401 controls, in response to a signal of a first signal terminal Vclock1, a connection state between the first signal terminal Vclock1 and the first pull-down node Q1.

The second pull-down generation module 402 controls, in response to a signal of a second signal terminal Vclock2, a connection state between the second signal terminal Vclock2 and the second pull-down node Q2, where a structure of the first pull-down generation module 401 is the same as that of the second pull-down generation module 402.

The first pull-down control module 3011 controls, in response to a signal of the first pull-down node Q1, a connection state between the first pull-up node P1 and the third voltage terminal V3 and a connection state between the fourth voltage terminal V4 and the first output terminal Gout1. The second pull-down control module 3012 controls, in response to a signal of the second pull-down node Q2, a connection state between the first pull-up node P1 and the third voltage terminal V3 and a connection state between the fourth voltage terminal V4 and the first output terminal Gout1.

The third pull-down control module 3021 controls, in response to the signal of the second pull-down node Q2, a connection state between the second pull-up node P2 and the third voltage terminal V3 and a connection state between the fourth voltage terminal V4 and the second output terminal Gout2; and the fourth pull-down control module 3022 controls, in response to the signal of the first pull-down node Q1, a connection state between the second pull-up node P2 and the third voltage terminal V3 and a connection state between the fourth voltage terminal V4 and the second output terminal Gout2, where a structure of the first pull-down control module 3011 is the same as that of the third pull-down control module 3021, and a structure of the second pull-down control module 3012 is the same as that of the fourth pull-down control module 3022.

The first output module 501 controls, in response to the signal of the first pull-up node P1, a connection state between a first clock signal terminal CK1 and the first output terminal Gout1, and the second output module 502 controls, in response to the signal of the second pull-up node P2, a connection state between a second clock signal terminal CK2 and the second output terminal Gout2. A phase difference of signals outputted by the first clock signal terminal CK1 and the second clock signal terminal CK2 is 180 degree, and a structure of the first output module 501 is the same as that of the second output module 502.

The first cascade output module 601 controls, in response to the signal of the first pull-down node Q1 or the second pull-down node Q2, a connection state between the third voltage terminal V3 and the first cascade output terminal Gout1', and controls, in response to the signal of the first pull-up node P1, a connection state between the first clock signal terminal CK1 and the first cascade output terminal Gout1'.

The second cascade output module 602 controls, in response to the signal of the second pull-down node Q2 or the first pull-down node Q1, a connection state between the third voltage terminal V3 and the second cascade output terminal Gout2'. The second cascade output module 602 controls, in response to the signal of the second pull-up node P2, a connection state between the second clock signal terminal CK2 and the second cascade output terminal Gout2', where a structure of the first cascade output module 601 is the same as that of the second cascade output module 602.

The bi-directional scanning unit provided by the embodiment includes a first stage subunit and a second stage subunit. The bi-directional scanning unit can perform a scan in a direction from the first stage subunit to the second stage subunit, and can also perform a scan in a direction from the second stage subunit to the first stage subunit, thereby achieving a bi-directional scan. In the embodiment, a structure of composition modules of the first stage subunit is the same as that of the second stage subunit, and composition structures of various modules are also the same. By means of an interaction between first stage subunit and the second stage subunit in the process of scanning, one of the stage subunits does not output a scanning signal while the other one outputs a scanning signal, so that scanning signals are outputted by two stages of subunits stage by stage. In addition, by means of the interaction between two stages of subunits, the scanning of the two stages of subunits can be controlled without any external circuit, for ensuring a simple line structure and easy implementation of the bi-directional scanning unit.

Figure 2:
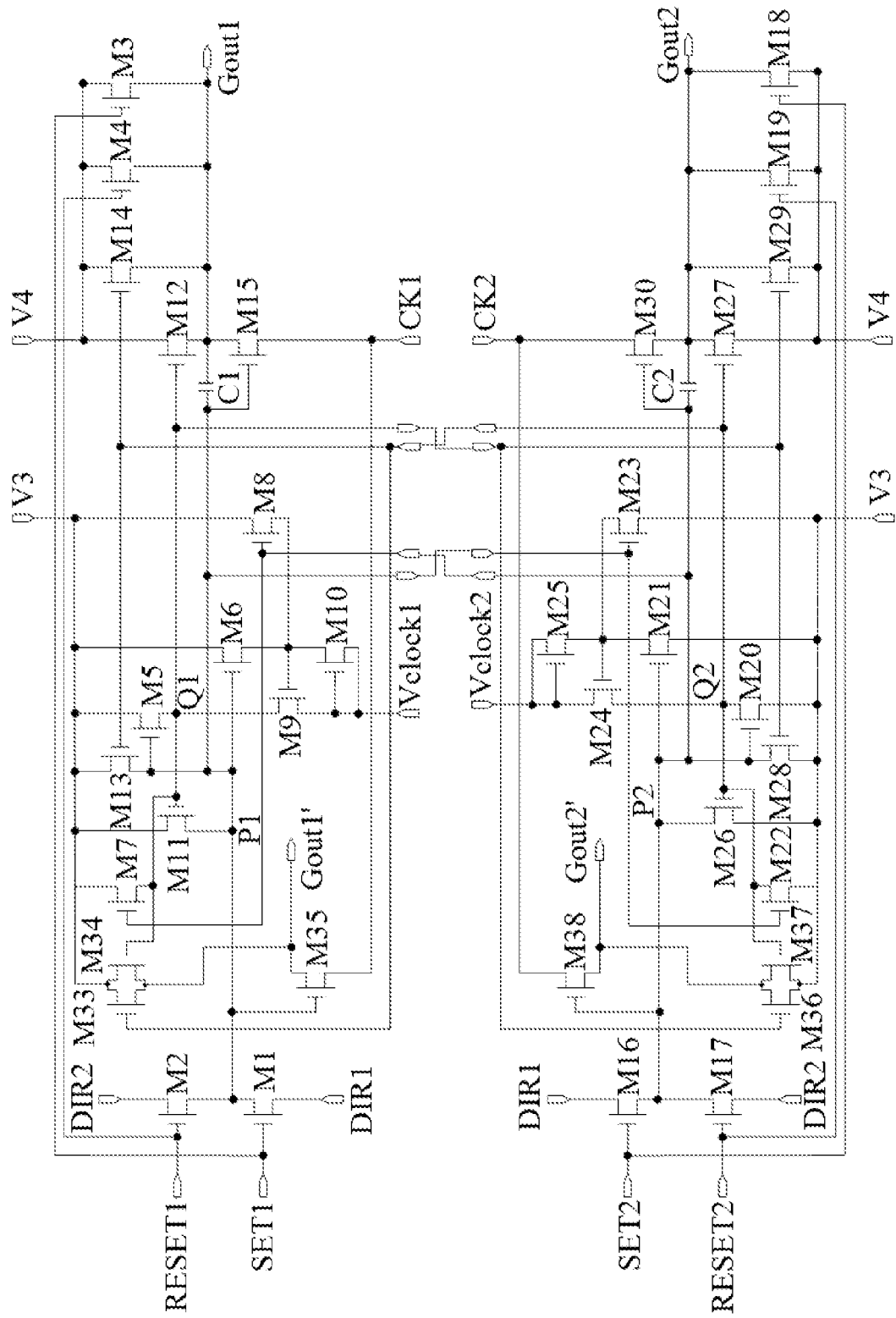
FIG. 2 is a schematic structural diagram of a bi-directional scanning unit according to another embodiment of the invention.

A specific bi-directional scanning unit according to an embodiment is described in detail in conjunction with FIG. 2. FIG. 2 is a schematic structural diagram of a bi-directional scanning unit according to another embodiment.

Referring to FIG. 2, the first input module 101 according to the embodiment includes a first transistor M1, a second transistor M2, a third transistor M3 and a fourth transistor M4.

A gate of the first transistor M1 is connected to the first control terminal SET1, a first terminal of the first transistor M1 is connected to the first voltage terminal DIR1, and a second terminal of the first transistor M1 is connected to the first pull-up node P1. A gate of the second transistor M2 is connected to the second control terminal RESET1, a first terminal of the second transistor M2 is connected to the second voltage terminal DIR2, and a second terminal of the second transistor M2 is connected to the first pull-up node P1. A gate of the third transistor M3 is connected to the first control terminal SET1, a first terminal of the third transistor M3 is connected to the fourth voltage terminal V4, and a second terminal of the third transistor M3 is connected to the first output terminal Gout1. A gate of the fourth transistor M4 is connected to the second control terminal RESET1, a first terminal of the fourth transistor M4 is connected to the fourth voltage terminal V4, and a second terminal of the fourth transistor M4 is connected to the first output terminal Gout1.

With the same composition structure as the first input module 101, the second input module 102 includes four transistors, which are a sixteenth transistor M16, a seventeenth transistor M17, an eighteenth transistor M18, and a nineteenth transistor M19.

A gate of the sixteenth transistor M16 is connected to the third control terminal SET2, a first terminal of the sixteenth transistor M16 is connected to the first voltage terminal DIR1, and a second terminal of the sixteenth transistor M16 is connected to the second pull-up node P2. A gate of the seventeenth transistor M17 is connected to the fourth control terminal RESET2, a first terminal of the seventeenth transistor M17 is connected to the second voltage terminal DIR2, and a second terminal of the seventeenth transistor M17 is connected to the second pull-up node P2. A gate of the eighteenth transistor M18 is connected to the third control terminal SET2, a first terminal of the eighteenth transistor M18 is connected to the fourth voltage terminal V4, and a second terminal of the eighteenth transistor M18 is connected to the second output terminal Gout2. A gate of the nineteenth transistor M19 is connected to the fourth control terminal RESET2, a first terminal of the nineteenth transistor M19 is connected to the fourth voltage terminal V4, and a second terminal of the nineteenth transistor M19 is connected to the second output terminal Gout2.

It is to be noted that, in this embodiment, conductive types of the first transistor M1, the second transistor M2, the third transistor M3 and the fourth transistor M4 are the same; and conductive types of the sixteenth transistor M16, the seventeenth transistor M17, the eighteenth transistor M18, and the nineteenth transistor M19 are the same. In a certain embodiment, since signals of the first pull-up node P1 and the second pull-up node P2 are required to be clear, for the first input module 101, when the first control terminal SET1 controls an activation of a connection between the first pull-up node P1 and the first voltage terminal DIR1, the second control terminal RESET1 cannot control the activation of an activation of a connection between the first pull-up node P1 and the second voltage terminal DIR2. When the second control terminal RESET1 controls an activation of an activation of a connection between the first pull-up node P1 and the second voltage terminal DIR2, the first control terminal SET1 cannot control an activation of an activation of a connection between the first pull-up node P1 and the first voltage terminal DIR1. Similarly, for the second input module 102, when the third control terminal SET2 controls an activation of a connection between the second pull-up node P2 and the first voltage terminal DIR1, the fourth control terminal RESET2 cannot control an activation of a connection between the second pull-up node P2 and the second voltage terminal DIR2, and when the fourth control terminal RESET2 controls an activation of a connection between the second pull-up node P2 and the second voltage terminal DIR2, the third control terminal SET2 cannot control an activation of a connection between the second pull-up node P2 and the first voltage terminal DIR1. That is to say, the first transistor M1 and the second transistor M2 cannot be turned on at the same time, and likewise, the sixteenth transistor M16 and the seventeenth transistor M17 cannot be turned on at the same time.

In the embodiment, signals outputted by the third voltage terminal V3 and the fourth voltage terminal V4 have a same level, which signal may be a high level signal and may also be a low level signal, depending on practical applications, as long as a signal outputted by the fourth voltage terminal V4 cannot scan gate lines (that is, the signal cannot scan a pixel array connected to the gate lines) and cannot control a transistor which is directly or indirectly connected to the third voltage terminal V3.

Referring to FIG. 2, the first pull-up control module 2011 according to the embodiment includes a fifth transistor M5 and a sixth transistor M6.

A gate of the fifth transistor M5 is connected to the first pull-up node P1, a first terminal of the fifth transistor M5 is connected to the third voltage terminal V3, and a second terminal of the fifth transistor M5 is connected to the first pull-down node Q1. A gate of the sixth transistor M6 is connected to the first pull-up node P1, a first terminal of the sixth transistor M6 is connected to the third voltage terminal V3, and a second terminal of the sixth transistor M6 is connected to the first pull-down generation module 401.

With the same composition structure as the first pull-up control module 2011, the third pull-up control module 2021 includes two transistors, which are a twentieth transistor M20 and a twenty-first transistor M21.

A gate of the twentieth transistor M20 is connected to the second pull-up node P2, a first terminal of the twentieth transistor M20 is connected to the third voltage terminal V3, and a second terminal of the twentieth transistor M20 is connected to the second pull-down node Q2. A gate of the twenty-first transistor M21 is connected to the second pull-up node P2, a first terminal of the twenty-first transistor M21 is connected to the third voltage terminal V3, and a second terminal of the twenty-first transistor M21 is connected to the second pull-down generation module 402.

Referring to FIG. 2, the second pull-up control module 2012 includes a seventh transistor M7 and an eighth transistor M8.

A gate of the seventh transistor M7 is connected to the second pull-up node P2, a first terminal of the seventh transistor M7 is connected to the third voltage terminal V3, and a second terminal of the seventh transistor M7 is connected to the first pull-down node Q1. A gate of the eighth transistor M8 is connected to the second pull-up node P2, a first terminal of the eighth transistor M8 is connected to the third voltage terminal V3, and a second terminal of the eighth transistor M8 is connected to the first pull-down generation module 401.

With the same composition structure as the second pull-up control module 2012, the fourth pull-up control module 2022 includes two transistors, which are a twenty-second transistor M22 and a twenty-third transistor M23.

A gate of the twenty-second transistor M22 is connected to the first pull-up node P1, a first terminal of the twenty-second transistor M22 is connected to the third voltage terminal V3, and a second terminal of the twenty-second transistor M22 is connected to the second pull-down node Q2. A gate of the twenty-third transistor M23 is connected to the first pull-up node P1, a first terminal of the twenty-third transistor M23 is connected to the third voltage terminal V3, and a second terminal of the twenty-third transistor M23 is connected to the second pull-down generation module 402.

Referring to FIG. 2, the first pull-down generation module 401 according to the embodiment includes a ninth transistor M9 and a tenth transistor M10.

A gate of the ninth transistor M9 is connected to the second terminal of the sixth transistor M6 and the second terminal of the eighth transistor M8, a first terminal of the ninth transistor M9 is connected to the first signal terminal Vclock1, and a second terminal of the ninth transistor M9 is connected to the first pull-down node Q1. A gate and a first terminal of the tenth transistor M10 are both connected to the first signal terminal Vclock1, and a second terminal of the tenth transistor M10 is connected to the second terminal of the sixth transistor M6 and the second terminal of the eighth transistor M8.

With the same composition structure as the first pull-down generation module 401, the second pull-down generation module 402 includes two transistors, which are a twenty-fourth transistor M24 and a twenty-fifth transistor M25.

A gate of the twenty-fourth transistor M24 is connected to the second terminal of the twenty-first transistor M21 and the second terminal of the twenty-third transistor M23, a first terminal of the twenty-fourth transistor M24 is connected to the second signal terminal Vclock2, and a second terminal of the twenty-fourth transistor M24 is connected to the second pull-down node Q2. A gate and a first terminal of the twenty-fifth transistor M25 are both connected to the second signal terminal Vclock2, and a second terminal of the twenty-fifth transistor M25 is connected to the second terminal of the twenty-first transistor M21 and the second terminal of the twenty-third transistor M23.

As to be noted, in an embodiment, conductive types of the fifth transistor M5, the sixth transistor M6, the seventh transistor M7, the eighth transistor M8, the twenty transistor M20, the twenty-first transistor M21, the twenty-second transistor M22 and the twenty-third transistor M23 are the same; and conductive types of the ninth transistor M9, the tenth transistor M10, the twenty-fourth transistor M24 and the twenty-fifth transistor M25 are the same. When the sixth transistor M6 and/or the eighth transistor M8 are turned on, it should be ensured that an activation of a connection between the first pull-down generation module 401 and the first pull-down node Q1 is turned on, and therefore, a signal outputted by the third voltage terminal V3 should control a deactivation of a connection between the first pull-down generation module 401 and the first pull-down node Q1. When the twenty-first transistor M21 and/or the twenty-third transistor M23 are turned on, it should be ensured that a connection between the second pull-down generation module 402 and the second pull-down node Q2 is turned on, and therefore, the signal outputted by the third voltage terminal V3 should control a deactivation of a connection between the second pull-down generation module 402 and the second pull-down node Q2. In an embodiment, in order to ensure that the signal outputted by the third voltage terminal V3 controls a deactivation of a connection between a pull-down generation module and a pull-down node, a width to length ratio of the sixth transistor M6 and that of the eighth transistor M8 each are greater than that of the tenth transistor M10; and a width to length ratio of the twenty-first transistor M21 and that of the twenty-third transistor M23 each are greater than that of the twenty-fifth transistor M25. The width to length ratios of the sixth transistor M6, the eighth transistor M8, the tenth transistor M10, the twenty-first transistor M21, the twenty-third transistor M23 and the twenty-fifth transistor M25 are not limited in the present application, which needs to be specifically designed according to practical applications.

Referring to FIG. 2, the first pull-down control module 3011 according to the embodiment includes an eleventh transistor M11 and a twelfth transistor M12.

A gate of the eleventh transistor M11 is connected to the first pull-down node Q1, a first terminal of the eleventh transistor M11 is connected to the third voltage terminal V3, and a second terminal of the eleventh transistor M11 is connected to the first pull-up node P1. A gate of the twelfth transistor M12 is connected to the first pull-down node Q1, a first terminal of the twelfth transistor M12 is connected to the fourth voltage terminal V4, and a second terminal of the twelfth transistor M12 is connected to the first output terminal Gout1.

With the same composition structure as the first pull-down control module 3011, the third pull-down control module 3021 includes two transistors, which are a twenty-sixth transistor M26 and a twenty-seventh transistor M27.

A gate of the twenty-sixth transistor M26 is connected to the second pull-down node Q2, a first terminal of the twenty-sixth transistor M26 is connected to the third voltage terminal V3, and a second terminal of the twenty-sixth transistor M26 is connected to the second pull-up node P2.

A gate of the twenty-seventh transistor M27 is connected to the second pull-down node Q2, a first terminal of the twenty-seventh transistor M27 is connected to the fourth voltage terminal V4, and a second terminal of the twenty-seventh transistor M27 is connected to the second output terminal Gout2.

The second pull-down control module 3012 according to the embodiment includes a thirteenth transistor M13 and a fourteenth transistor M14.

A gate of the thirteenth transistor M13 is connected to the second pull-down node Q2, a first terminal of the thirteenth transistor M13 is connected to the third voltage terminal V3, and a second terminal of the thirteenth transistor M13 is connected to the first pull-up node P1. A gate of the fourteenth transistor M14 is connected to the second pull-down node Q2, a first terminal of the fourteenth transistor M14 is connected to the fourth voltage terminal V4, and a second terminal of the fourteenth transistor M14 is connected to the first output terminal Gout1.

With the same composition structure as the second pull-down control module 3012, the fourth pull-down control module 3022 includes two transistors, which are a twenty-eighth transistor M28 and a twenty-ninth transistor M29.

A gate of the twenty-eighth transistor M28 is connected to the first pull-down node Q1, a first terminal of the twenty-eighth transistor M28 is connected to the third voltage terminal V3, and a second terminal of the twenty-eighth transistor M28 is connected to the second pull-up node P2. A gate of the twenty-ninth transistor M29 is connected to the first pull-down node Q1, a first terminal of the twenty-ninth transistor M29 is connected to the fourth voltage terminal V4, and a second terminal of the twenty-ninth transistor M29 is connected to the second output terminal Gout2.

Referring to FIG. 2, the first output module 501 according to the embodiment includes a fifteenth transistor M15 and a first bootstrap capacitor C1.

A gate of the fifteenth transistor M15 and a first plate of the first bootstrap capacitor C1 are both connected to the first pull-up node P1, a first terminal of the fifteenth transistor M15 is connected to the first clock signal terminal CK1, and a second terminal of the fifteenth transistor M15 and a second plate of the first bootstrap capacitor C1 are both connected to the first output terminal Gout1. That is, the second terminal of the fifteenth transistor M15 is connected to the second plate of the first bootstrap capacitor C1 and to the first output terminal Gout1.

With the same composition structure as the first output module 501, the second output module 502 includes a transistor and a bootstrap capacitor, which are a thirtieth transistor M30 and a second bootstrap capacitor C2.

A gate of the thirtieth transistor M30 and a first plate of the second bootstrap capacitor C2 are both connected to the second pull-up node P2, a first terminal of the thirtieth transistor M30 is connected to the second clock signal terminal CK2, and a second terminal of the thirtieth transistor M30 and a second plate of the second bootstrap capacitor C2 are both connected to the second output terminal Gout2. That is, the second terminal of the thirtieth transistor M30 is connected to the second plate of the second bootstrap capacitor C2 and to the second output terminal Gout2.

In the embodiment, a voltage outputted by the third voltage terminal V3 is lower than a voltage outputted by the fourth voltage terminal V4, so that a corresponding pull-up node controls a corresponding output module to be turned off and a corresponding pull-down node controls an activation of a connection between the third voltage terminal V3 and a corresponding output terminal, ensuring significantly-decreased leakage current of transistor of the corresponding output module, alleviating the problem of a large leakage current of the bi-directional scanning unit, and ensuring stability of the bi-directional scanning unit. Specific values of the voltage outputted by the third voltage terminal V3 and the voltage outputted by the fourth voltage terminal V4 are not limited in the present application, which needs to be designed according to practical applications.

Referring to FIG. 2, the first cascade output module 601 according to the embodiment includes a thirty-third transistor M33, a thirty-fourth transistor M34 and a thirty-fifth transistor M35.

A gate of the thirty-third transistor M33 is connected to the second pull-down node Q2, a first terminal of the thirty-third transistor M33 is connected to the third voltage terminal V3, and a second terminal of the thirty-third transistor M33 is connected to the first cascade output terminal Gout1'. A gate of the thirty-fourth transistor M34 is connected to the first pull-down node Q1, a first terminal of the thirty-fourth transistor M34 is connected to the third voltage terminal V3, and a second terminal of the thirty-fourth transistor M34 is connected to the first cascade output terminal Gout1'. A gate of the thirty-fifth transistor M35 is connected to the first pull-up node P1, a first terminal of the thirty-fifth transistor M35 is connected to the first clock signal terminal CK1, and a second terminal of the thirty-fifth transistor M35 is connected to the first cascade output terminal Gout1'.

The second cascade output module includes a thirty-sixth transistor M36, a thirty-seventh transistor M37 and a thirty-eighth transistor M38.

A gate of the thirty-sixth transistor M36 is connected to the first pull-down node Q1, a first terminal of the thirty-sixth transistor M36 is connected to the third voltage terminal V3, and a second terminal of the thirty-sixth transistor M36 is connected to the second cascade output terminal Gout2'. A gate of the thirty-seventh transistor M37 is connected to the second pull-down node Q2, a first terminal of the thirty-seventh transistor M37 is connected to the third voltage terminal V3, and a second terminal of the thirty-seventh transistor M37 is connected to the second cascade output terminal Gout2'. A gate of the thirty-eighth transistor M38 is connected to the second pull-up node P2, a first terminal of the thirty-eighth transistor M38 is connected to the second clock signal terminal CK2, and a second terminal of the thirty-eighth transistor M38 is connected to the second cascade output terminal Gout2'.

In any one of the above embodiments, a level of a signal outputted by the first signal terminal Vclock1 may be the same as that outputted by the second signal terminal Vclock2. In order to reduce a power consumption, in the disclosure, the level of the signal outputted by the first signal terminal Vclock1 may be opposite to that outputted by the second signal terminal Vclock2, and the signal outputted by the first signal terminal Vclock1 and the signal outputted by the second signal terminal Vclock2 are frame-inversed with respect to each other. That is, after the gate driving circuit finishes the scanning of a frame of picture, a phase of the signal outputted by the first signal terminal Vclock1 is opposite to that of the signal outputted by the second signal terminal Vclock2. Each of the transistors according to the present application is preferably a thin film transistor.

Various composition modules of the bi-directional scanning unit according to the embodiment and turn-on and turn-off situations of various transistors forming each module are further described below in conjunction with a driving method. As to be noted, an example is taken that the first transistor M1 to the thirty transistor M30 and the thirty-third transistor M33 to the thirty-eighth transistor M38 are N-type transistors, that output signals of the third voltage terminal V3 and the fourth voltage terminal V4 are low level signals, and that a scanning signal is a high level signal.

The driving method according to the embodiment is described in detail in conjunction with FIG. 1, FIG. 2, FIG. 3a and FIG. 3b. The driving method according to the embodiment is applied to the above bi-directional scanning unit. The driving method includes a first stage T1, a second stage T2, a third stage T3 and a fourth stage T4.

Figure 3A:
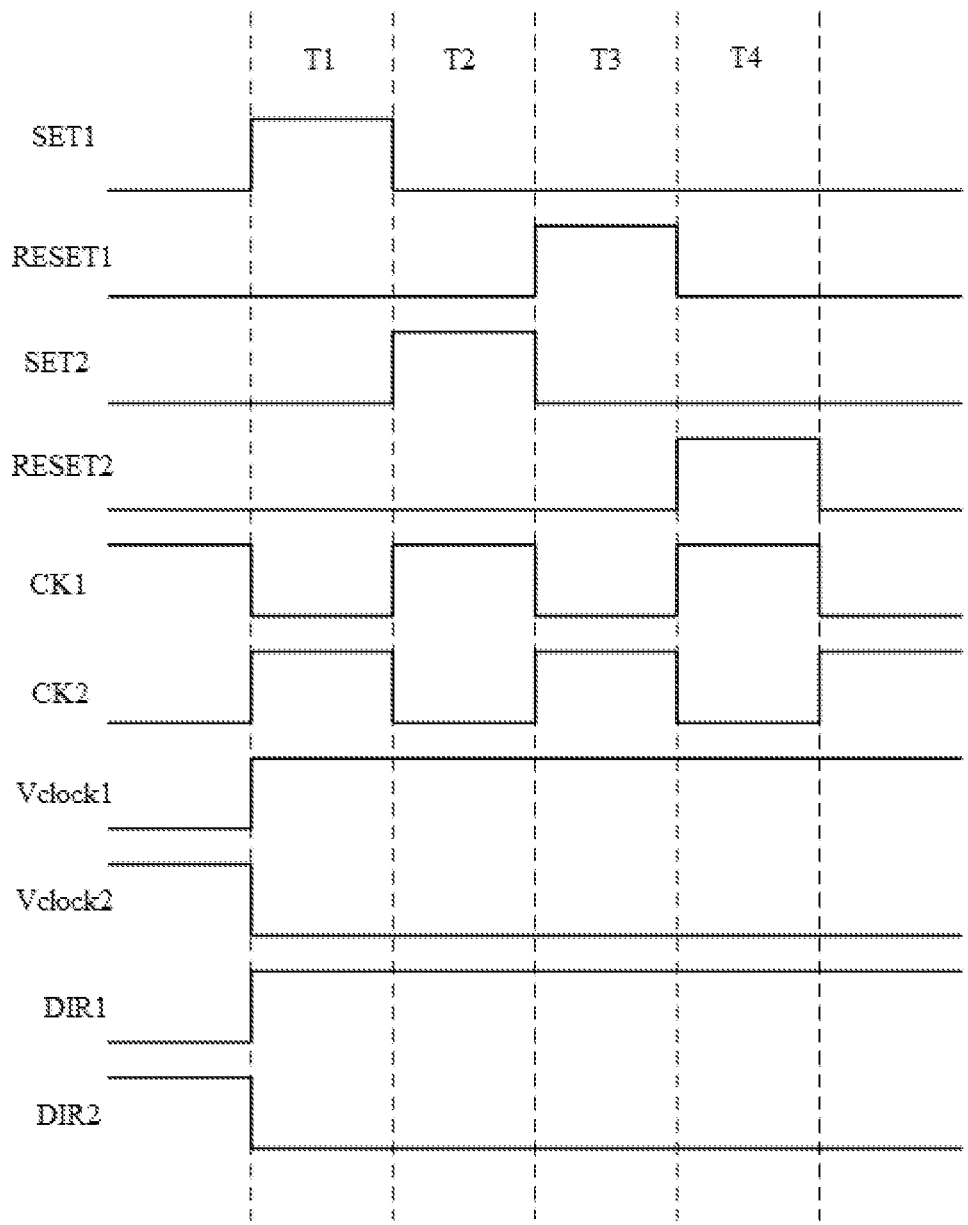
FIG. 3a is a timing diagram of a forward scan according to an embodiment of the invention.

Reference is made to FIG. 3a, which is a timing diagram of a forward scan according to an embodiment, that is, scanning is performed in a direction from a first stage subunit to a second stage subunit, where a signal outputted by a first voltage terminal DIR1 is a high level signal, and a signal outputted by a second voltage terminal DIR2 is a low level signal. When scanning in the direction from the first stage subunit to the second stage subunit, the method is as follows.

In the first stage T1, the first input module 101 controls, in response to a signal of the first control terminal SET1, an activation of a connection between the first voltage terminal DIR1 and the first pull-up node P1, and an activation of a connection between the fourth voltage terminal V4 and the first output terminal Gout1. The first pull-up control module 2011 controls, in response to a signal of the first pull-up node P1, a deactivation of a connection between the first pull-down node Q1 and the third voltage terminal V3 and a deactivation of a connection between the first pull-down node Q1 and the first pull-down generation module 401. The fourth pull-up control module 2022 controls, in response to the signal of the first pull-up node P1, an activation of a connection between the second pull-down node Q2 and the third voltage terminal V3, and a deactivation of a connection between the second pull-down node Q2 and the second pull-down generation module 402. The first output module 501 controls, in response to the signal of the first pull-up node P1, an activation of a connection between the first clock signal terminal CK1 and the first output terminal Gout1. The first cascade output module 601 controls, in response to the signal of the first pull-up node P1, an activation of a connection between the first clock signal terminal CK1 and the first cascade output terminal Gout1'.

Referring to FIG. 2 and FIG. 3a specifically, in the first stage T1, the first control terminal SET1 outputs a high level signal and then controls the first transistor M1 and the third transistor M3, so that the signal of the first pull-up node P1 is a high level signal outputted by the first voltage terminal DIR1 and a signal of the first output terminal Gout1 is a low level signal outputted by the fourth voltage terminal V4. The first pull-up node P1 controls the fifth transistor M5 and the sixth transistor M6, and the twenty-second transistor M22 and the twenty-third transistor M23, so that signals of both the first pull-down node Q1 and the second pull-down node Q2 are a low level signal outputted by the third voltage terminal V3 and control a deactivation of a connection between the first pull-down generation module 401 and the first pull-down node Q1 and a deactivation of a connection between the second pull-down generation module 402 and the second pull-down node Q2. The first pull-up node P1 further controls the thirty-fifth transistor M35, so that an output signal of the first cascade output terminal Gout1' is a low level signal outputted by the first clock signal terminal CK1. The first pull-up node P1 further controls the fifteenth transistor M15, so that the low level signal outputted by the first clock signal terminal CK1 is outputted to the first output terminal Gout1.

In the second stage T2, the first output module 501 controls, in response to the signal of the first pull-up node P1, an activation of a connection between the first clock signal terminal CK1 and the first output terminal Gout1. The first cascade output module 601 controls, in response to the signal of the first pull-up node P1, an activation of a connection between the first clock signal terminal CK1 and the first cascade output terminal Gout1', with an output signal of the first clock signal terminal CK1 being a scanning signal. The second input module 102 controls, in response to a signal of the third control terminal SET2, an activation of a connection between the first voltage terminal DIR1 and the second pull-up node P2, and an activation of a connection between the fourth voltage terminal V4 and the second output terminal Gout2. The first pull-up control module 2011 controls, in response to the signal of the first pull-up node P1, an activation of a connection between the first pull-down node Q1 and the third voltage terminal V3, and an activation of a connection between the first pull-down node Q1 and the first pull-down generation module 401. The second pull-up control module 2012 controls, in response to a signal of the second pull-up node P2, an activation of a connection between the first pull-down node Q1 and the third voltage terminal V3, and a deactivation of a connection between the first pull-down node Q1 and the first pull-down generation module 401. The third pull-up control module 2021 controls, in response to the signal of the second pull-up node P2, an activation of a connection between the second pull-down node Q2 and the third voltage terminal V3, and a deactivation of a connection between the second pull-down node Q2 and the second pull-down generation module 402. The fourth pull-up control module 2022 controls, in response to the signal of the first pull-up node P1, an activation of a connection between the second pull-down node Q2 and the third voltage terminal V3, and a deactivation of a connection between the second pull-down node Q2 and the second pull-down generation module 402. The second output module 502 controls, in response to the signal of the second pull-up node P2, an activation of a connection between the second clock signal terminal CK2 and the second output terminal Gout2. The second cascade output module 602 controls, in response to the signal of the second pull-up node P2, an activation of a connection between the second clock signal terminal CK2 and the second cascade output terminal Gout2'.

Referring to FIG. 2 and FIG. 3a specifically, in the second stage T2, the fifteenth transistor M15 outputs a high level signal (which is a scanning signal), which is outputted by the first clock signal terminal CK1, to the first output terminal Gout1 and a plate of the first bootstrap capacitor C1. The first output terminal Gout1 scans a gate line connected to it. The first bootstrap capacitor C1 pulls up the signal of the first pull-up node P1 connected to the other plate of the first bootstrap capacitor C1. The first cascade output terminal Gout1' outputs a high level signal, which is outputted by the first clock signal terminal CK1. Since the signal of the first pull-up node P1 is a high level signal with higher level, the transistor directly or indirectly connected to the first pull-up node P1 remains in the state as in the first stage T1. In addition, in the second stage T2, the third control terminal SET2 outputs a high level signal to control the sixteenth transistor M16 and the eighteen transistor M18, so that the signal of the second pull-up node P2 is a high level signal outputted by the first voltage terminal DIR1 and the second output terminal Gout2 outputs a low level signal outputted by the fourth voltage terminal V4. The second pull-up node P2 controls the twenty transistor M20 and the twenty-first transistor M21 and the seventh transistor M7 and the eighth transistor M8, so that signals of both the second pull-down node Q2 and the first pull-down node Q1 are a low level signal outputted by the third voltage terminal V3, and maintains an activation of a connection between the first pull-down generation module 401 and the first pull-down node Q1 and an activation of a connection between the second pull-down generation module 402 and the second pull-down node Q2 in the off-state. The second pull-up node P2 further controls the thirty-eighth transistor M38, so that an output signal of the second cascade output terminal Gout2' is a low level signal outputted by the second clock signal terminal CK2. The second pull-up node P2 further controls the thirtieth transistor M30, and the thirtieth transistor M30 outputs the low level signal, which is outputted by the second clock signal terminal CK2, to the second output terminal Gout2.

In the third stage T3, the second output module 502 controls, in response to the signal of the second pull-up node P2, an activation of a connection between the second clock signal terminal CK2 and the second output terminal Gout2. The second cascade output module 602 controls, in response to the signal of the second pull-up node P2, an activation of a connection between the second clock signal terminal CK2 and the second cascade output terminal Gout2', with an output signal of the second clock signal terminal CK2 being a scanning signal. The first input module 101 controls, in response to a signal of the second control terminal RESET1, an activation of a connection between the second voltage terminal DIR2 and the first pull-up node P1, and an activation of a connection between the fourth voltage terminal V4 and the first output terminal Gout1. The third pull-up control module 2021 controls, in response to the signal of the second pull-up node P2, an activation of a connection between the second pull-down node Q2 and the third voltage terminal V3, and an activation of a connection between the second pull-down node Q2 and the second pull-down generation module 402. The second pull-up control module 2012 controls, in response to the signal of the second pull-up node P2, an activation of a connection between the first pull-down node Q1 and the third voltage terminal V3, and a deactivation of a connection between the first pull-down node Q1 and the first pull-down generation module 401.

Referring to FIG. 2 and FIG. 3a specifically, in the third stage T3, the thirtieth transistor M30 outputs a high level signal (which is a scanning signal), which is outputted by the second clock signal terminal CK2, to the second output terminal Gout2 and a plate of the second bootstrap capacitor C2. The second output terminal Gout2 scans a gate line connected to it. The second bootstrap capacitor C2 pulls up the signal of the second pull-up node P2 connected to the other plate of the second bootstrap capacitor C2. The second cascade output terminal Gout2' outputs a high level signal, which is outputted by the second clock signal terminal CK2. Since the signal of the second pull-up node P2 is a high level signal with higher level, the transistor directly or indirectly connected to the second pull-up node P2 remains in the state as in the second stage T2. In addition, in the third stage T3, the second control terminal RESET1 outputs a high level signal to control the second transistor M2 and the fourth transistor M4, so that the signal of the first pull-up node P1 is a low level signal outputted by the second voltage terminal DIR2 and the first output terminal Gout1 outputs a low level signal outputted by the third voltage terminal V3. In this case, all the transistors connected to the first pull-up node P1 are in the off-state.

In the fourth stage T4, the second input module 102 controls, in response to a signal of the fourth control terminal RESET2, an activation of a connection between the second voltage terminal DIR2 and the second pull-up node P2, and an activation of a connection between the fourth voltage terminal V4 and the second output terminal Gout2. The first pull-down generation module 401 controls, in response to a signal of the first signal terminal Vclock1, an activation of a connection between the first signal terminal Vclock1 and the first pull-down node Q1. The first pull-down control module 3011 controls, in response to a signal of the first pull-down node Q1, an activation of a connection between the first pull-up node P1 and the third voltage terminal V3, and an activation of a connection between the fourth voltage terminal V4 and the first output terminal Gout1. The fourth pull-down control module 3022 controls, in response to the signal of the first pull-down node Q1, an activation of a connection between the second pull-up node P2 and the third voltage terminal V3, and an activation of a connection between the fourth voltage terminal V4 and the second output terminal Gout2. The first cascade output module 601 controls, in response to the signal of the first pull-down node Q1, an activation of a connection between the third voltage terminal V3 and the first cascade output terminal Gout1'. The second cascade output module 602 controls, in response to the signal of the first pull-down node Q1, an activation of a connection between the third voltage terminal V3 and the second cascade output terminal Gout2'. Alternatively, the second pull-down generation module 402 controls, in response to a signal of the second signal terminal Vclock2, an activation of a connection between the second signal terminal Vclock2 and the second pull-down node Q2. The third pull-down control module 3021 controls, in response to the signal of the second pull-down node Q2, an activation of a connection between the second pull-up node P2 and the third voltage terminal V3, and an activation of a connection between the fourth voltage terminal V4 and the second output terminal Gout2. The second pull-down control module 3012 controls, in response to the signal of the second pull-down node Q2, an activation of a connection between the first pull-up node P1 and the third voltage terminal V3, and an activation of a connection between the fourth voltage terminal V4 and the first output terminal Gout1. The first cascade output module 601 controls, in response to the signal of the second pull-down node Q2, an activation of a connection between the third voltage terminal V3 and the first cascade output terminal Gout1'. The second cascade output module 602 controls, in response to the signal of the second pull-down node Q2, an activation of a connection between the third voltage terminal V3 and the second cascade output terminal Gout2'.

Referring to FIG. 2 and FIG. 3a specifically, in the fourth stage T4, the fourth control terminal RESET2 outputs a high level signal to control the seventeenth transistor M17 and the nineteenth transistor M19, so that the signal of the second pull-up node P2 is a low level signal outputted by the second voltage terminal DIR2 and a signal of the second output terminal Gout2 is a low level signal outputted by the fourth voltage terminal V4. Since all the transistors connected to the first pull-up node P1 and connected to the second pull-up node P2 are in the off-state in the fourth stage T4, an activation of a connection between the first pull-down generation module 401 and the first pull-down node Q1 and an activation of a connection between the second pull-down generation module 402 and the second pull-down node Q2 cannot be prevented from being turned on again. Referring to FIG. 3a, in an embodiment, a signal outputted by the first signal terminal Vclock1 is a high level signal, and a signal outputted by the second signal terminal Vclock2 is a low level signal. Therefore, the tenth transistor M10 of the first pull-down generation module 401 transmits, in response to a control of a high level signal outputted by the first signal terminal Vclock1, the high level signal to the gate of the ninth transistor M9, and the high level signal outputted by the first signal terminal Vclock1 is outputted to the first pull-down node Q1 after the ninth transistor M9 is turned on. The first pull-down node Q1 controls the eleventh transistor M11 and the twelfth transistor M12 and the twenty-eighth transistor M28 and the twenty-ninth transistor M29, so that signals of both the first pull-up node P1 and the second pull-up node P2 are a low level signal outputted by the third voltage terminal V3 and signals of both the first output terminal Gout1 and the second output terminal Gout2 are a low level signal outputted by the fourth voltage terminal V4. In addition, the first pull-down node Q1 controls the thirty-fourth transistor M34 and the thirty-sixth transistor M36, so that signals of both the first cascade output terminal Gout1' and the second cascade output terminal Gout2' are a low level signal outputted by the third voltage terminal V3.

Alternatively, in the forward scan, the signal of the second signal terminal Vclock2 may be a high level signal, and the signal of the first signal terminal Vclock1 may be a low level signal, which is not specifically limited in the present application.

Figure 3B:
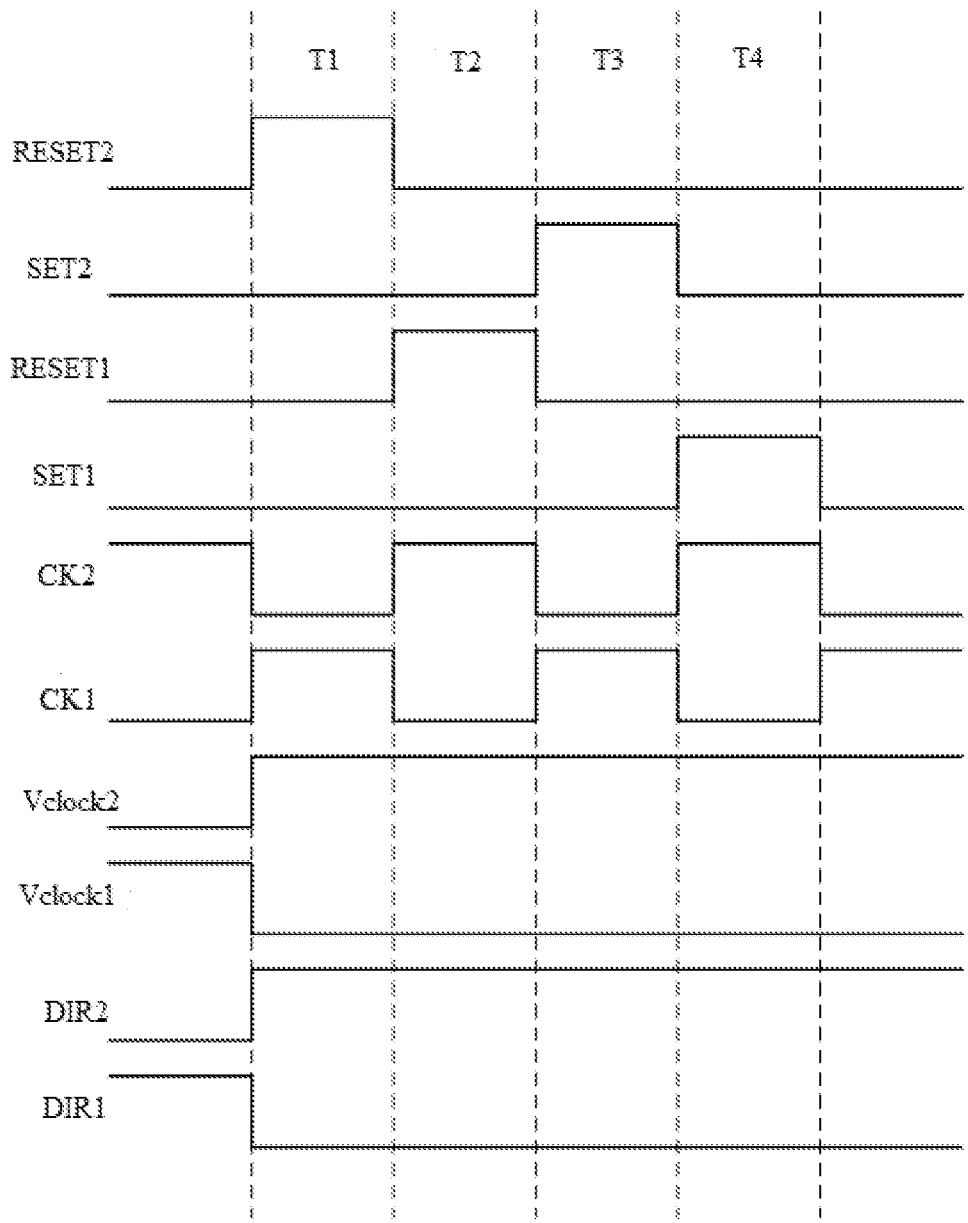
FIG. 3b is a timing diagram of a backward scan according to an embodiment of the invention.

Referring to FIG. 3b, which is a timing diagram of a backward scan according to an embodiment, the scanning is performed in a direction from a second stage subunit to a first stage subunit. In this case, a phase of a signal outputted by a first voltage terminal DIR1 is opposite to that outputted by a second voltage terminal DIR2, that is, the signal outputted by a first voltage terminal DIR1 is a low level signal, and the signal outputted by a second voltage terminal DIR2 is a high level signal. When scanning in the direction from the second stage subunit to the first stage subunit, the method is as follows.

In the first stage T1, the second input module 102 controls, in response to a signal of the fourth control terminal RESET2, an activation of a connection between the second voltage terminal DIR2 and the second pull-up node P2, and an activation of a connection between the fourth voltage terminal V4 and the second output terminal Gout2. The third pull-up control module 2021 controls, in response to a signal of the second pull-up node P2, an activation of a connection between the second pull-down node Q2 and the third voltage terminal V3, and an activation of a connection between the second pull-down node Q2 and the second pull-down generation module 402. The second pull-up control module 2012 controls, in response to the signal of the second pull-up node P2, an activation of a connection between the first pull-down node Q1 and the third voltage terminal V3, and an activation of a connection between the first pull-down node Q1 and the first pull-down generation module 401. The second output module 502 controls, in response to the signal of the second pull-up node P2, an activation of a connection between the second clock signal terminal CK2 and the second output terminal Gout2. The second cascade output module 602 controls, in response to the signal of the second pull-up node P2, an activation of a connection between the second clock signal terminal CK2 and the second cascade output terminal Gout2'.

Referring to FIG. 2 and FIG. 3b specifically, in the first stage T1, the fourth control terminal RESET2 outputs a high level signal to control the seventeenth transistor M17 and the ninth transistor M9, so that the signal of the second pull-up node P2 is a high level signal outputted by the second voltage terminal DIR2 and a signal of the first output terminal Gout1 is a low level signal outputted by the fourth voltage terminal V4. The second pull-up node P2 controls the twenty transistor M20 and the twenty-first transistor M21 and the seventh transistor M7 and the eighth transistor M8, so that a signal of second pull-down node Q2 is a low level signal outputted by the third voltage terminal V3, and an activation of a connection between the first pull-down generation module 401 and the first pull-down node Q1 is turned off and an activation of a connection between the second pull-down generation module 402 and the second pull-down node Q2 is turned off. The second pull-up node P2 further controls the thirty-eighth transistor M38, so that a signal of the second cascade output terminal Gout2' is a low level signal outputted by the second clock signal terminal CK2. The second pull-up node P2 further controls the thirtieth transistor M30, and the thirtieth transistor M30 outputs the low level signal, which is outputted by the second clock signal terminal CK2, to the second output terminal Gout2.

In the second stage T2, the second output module 502 controls, in response to the signal of the second pull-up node P2, an activation of a connection between the second clock signal terminal CK2 and the second output terminal Gout2. The second cascade output module 602 controls, in response to the signal of the second pull-up node P2, an activation of a connection between the second clock signal terminal CK2 and the second cascade output terminal Gout2', with an output signal of the second clock signal terminal CK2 being a scanning signal. The first input module 101 controls, in response to a signal of the second control terminal RESET1, an activation of a connection between the second voltage terminal DIR2 and the first pull-up node P1, and an activation of a connection between the fourth voltage terminal V4 and the first output terminal Gout1. The third pull-up control module 2021 controls, in response to the signal of the second pull-up node P2, an activation of a connection between the second pull-down node Q2 and the third voltage terminal V3, and an activation of a connection between the second pull-down node Q2 and the second pull-down generation module 402. The second pull-up control module 2012 controls, in response to the signal of the second pull-up node P2, an activation of a connection between the first pull-down node Q1 and the third voltage terminal V3, and an activation of a connection between the first pull-down node Q1 and the first pull-down generation module 401. The second output module 502 controls, in response to the signal of the second pull-up node P2, an activation of a connection between the second clock signal terminal CK2 and the second output terminal Gout2. The first pull-up control module 2011 controls, in response to the signal of the first pull-up node P1, an activation of a connection between the first pull-down node Q1 and the third voltage terminal V3, and an de activation of a connection between the first pull-down node Q1 and the first pull-down generation module 401. The fourth pull-up control module 2022 controls, in response to the signal of the first pull-up node P1, an activation of a connection between the second pull-down node Q2 and the third voltage terminal V3, and a deactivation of a connection between the second pull-down node Q2 and the second pull-down generation module 402. The first output module 501 controls, in response to the signal of the first pull-up node P1, an activation of a connection between the first clock signal terminal CK1 and the first output terminal Gout1. The first cascade output module 601 controls, in response to the signal of the first pull-up node P1, an activation of a connection between the first clock signal terminal CK1 and the first cascade output terminal Gout1'.

Referring to FIG. 2 and FIG. 3*b* specifically, in the second stage T2, the thirtieth transistor M30 outputs a high level signal (which is a scanning signal), which is outputted by the second clock signal terminal CK2, to the second output terminal Gout2 and a plate of the second bootstrap capacitor C2. The second output terminal Gout2 scans a gate line connected to it. The second bootstrap capacitor C2 pulls up the second pull-up node P2 connected to the other plate of the second bootstrap capacitor C2. The second cascade output terminal Gout2' outputs a high level signal, which is outputted by the second clock signal terminal CK2. Since the signal of the second pull-up node P2 is a high level signal with higher level, the transistor directly or indirectly connected to the second pull-up node P2 remain in the state as in the first stage T1. In addition, in the second stage T2, the second control terminal RESET1 outputs a high level signal to control the second transistor M2 and the fourth transistor M4, so that the signal of the first pull-up node P1 is a high level signal outputted by the second voltage terminal DIR2 and the signal of the first output terminal Gout1 is a low level signal outputted by the fourth voltage terminal V4. The first pull-up node P1 controls the fifth transistor M5 and the sixth transistor M6, and the twenty-second transistor M22 and the twenty-third transistor M23, so that signals of both the first pull-down node Q1 and the second pull-down node Q2 is a low level signal outputted by the third voltage terminal V3, and maintains an activation of a connection between the first pull-down generation module 401 and the first pull-down node Q1 and an activation of a connection between the second pull-down generation module 402 and the second pull-down node Q2 in the off-state. The first pull-up node P1 further controls the thirty-fifth transistor M35, so that the first cascade output terminal Gout1' outputs a low level signal outputted by the first clock signal terminal CK1. The first pull-up node P1 further controls the fifteenth transistor M15 to output the low level signal, which is outputted by the first clock signal terminal CK1, to the first output terminal Gout1.

In the third stage T3, the first output module 501 controls, in response to the signal of the first pull-up node P1, an activation of a connection between the first clock signal terminal CK1 and the first output terminal Gout1. The first cascade output module 601 controls, in response to the signal of the first pull-up node P1, an activation of a connection between the first clock signal terminal CK1 and the first cascade output terminal Gout1', with the output signal of the first clock signal terminal CK1 being a scanning signal. The second input module 102 controls, in response to a signal of the third control terminal SET2, an activation of a connection between the first voltage terminal DIR1 and the second pull-up node P2, and an activation of a connection between the fourth voltage terminal V4 and the second output terminal Gout2. The first pull-up control module 2011 controls, in response to the signal of the first pull-up node P1, an activation of a connection between the first pull-down node Q1 and the third voltage terminal V3, and a deactivation of a connection between the first pull-down node Q1 and the first pull-down generation module 401. The fourth pull-up control module 2022 controls, in response to the signal of the first pull-up node P1, an activation of a connection between the second pull-down node Q2 and the third voltage terminal V3, and an activation of a connection between the second pull-down node Q2 and the second pull-down generation module 402.

Referring to FIG. 2 and FIG. 3*b* specifically, in the third stage T3, the fifteenth transistor M15 outputs a high level signal (which is a scanning signal), which is outputted by the first clock signal terminal CK1, to the first output terminal Gout1 and a plate of the first bootstrap capacitor C1. The first output terminal Gout1 scans a gate line connected to it. The first bootstrap capacitor C1 pulls up a signal of the first pull-up node P1 connected to the other plate of the first bootstrap capacitor C1. The first cascade output terminal Gout1' outputs a high level signal, which is outputted by the first clock signal terminal CK1. Since the signal of the first pull-up node P1 is a high level signal with higher level, the transistor directly or indirectly connected to the first pull-up node P1 remains in the state as in the first stage T3. In addition, in the third stage T3, the third control terminal SET2 outputs a high level signal to control the sixteenth transistor M16 and the eighteenth transistor M18, so that the signal of the second pull-up node P2 is a low level signal outputted by the first voltage terminal DIR1 and a signal of the second output terminal Gout2 is a low level signal outputted by the fourth voltage terminal V4. In this case, all the transistors connected to the second pull-up node P2 are in the off-state.

In the fourth stage T4, the first input module 101 controls, in response to a signal of the first control terminal SET1, an activation of a connection between the first voltage terminal DIR1 and the first pull-up node P1, and an activation of a connection between the fourth voltage terminal V4 and the first output terminal Gout1. The first pull-down generation module 401 controls, in response to a signal of the first signal terminal Vclock1, an activation of a connection between the first signal terminal Vclock1 and the first pull-down node Q1. The first pull-down control module 3011 controls, in response to a signal of the first pull-down node Q1, an activation of a connection between the first pull-up node P1 and the third voltage terminal V3, and an activation of a connection between the fourth voltage terminal V4 and the first output terminal Gout1. The fourth pull-down control module 3022 controls, in response to the signal of the first pull-down node Q1, an activation of a connection between the second pull-up node P2 and the third voltage terminal V3, and an activation of a connection between the fourth voltage terminal V4 and the second output terminal Gout2. The first cascade output module 601 controls, in response to the signal of the first pull-down node Q1, an activation of a connection between the third voltage terminal V3 and the first cascade output terminal Gout1'. The second cascade output module 602 controls, in response to the signal of the first pull-down node Q1, an activation of a connection between the third voltage terminal V3 and the second cascade output terminal Gout2'. Alternatively, the second pull-down generation module 402 controls, in response to a signal of the second signal terminal Vclock2, an activation of a connection between the second signal terminal Vclock2 and the second pull-down node Q2. The third pull-down control module 3021 controls, in response to the signal of the second pull-down node Q2, an activation of a connection between the second pull-up node P2 and the third voltage terminal V3, and an activation of a connection between the fourth voltage terminal V4 and the second output terminal Gout2. The second pull-down control module 3012 controls, in response to the signal of the second pull-down node Q2, an activation of a connection between the first pull-up node P1 and the third voltage terminal V3, and an activation of a connection between the fourth voltage terminal V4 and the first output terminal Gout1. The first cascade output module 601 controls, in response to the signal of the second pull-down node Q2, an activation of a connection between the third voltage terminal V3 and the first cascade output terminal Gout1'. The second cascade output module 602 controls, in response to the signal of the second pull-down node Q2, an activation of a connection between the third voltage terminal V3 and the second cascade output terminal Gout2'.

Referring to FIG. 2 and FIG. 3b specifically, in the fourth stage T4, the first control terminal SET1 outputs a high level signal to control the first transistor M1 and the third transistor M3, so that the signal of the first pull-up node P1 is a low level signal outputted by the first voltage terminal DIR1, and a signal of the first output terminal Gout1 is a low level signal outputted by the fourth voltage terminal V4. Since all the transistors connected to the first pull-up node P1 and connected to the second pull-up node P2 are in the off-state in the fourth stage T4, an activation of a connection between the first pull-down generation module 401 and the first pull-down node Q1 and an activation of a connection between the second pull-down generation module 402 and the second pull-down node Q2 cannot be prevented from being turned on again. Referring to FIG. 3b, in an embodiment, a signal outputted by the first signal terminal Vclock1 is a low level signal, and a signal outputted by the second signal terminal Vclock2 is a high level signal. Therefore, the twenty-fifth transistor M25 of the second pull-down generation module 402 transmits, in response to a control of a high level signal outputted by the second signal terminal Vclock2, the high level signal to the gate of the twenty-fourth transistor M24, and the high level signal outputted by the second signal terminal Vclock2 is outputted to the second pull-down node Q2 after the twenty-fourth transistor M24 is turned on. The second pull-down node Q2 controls the twenty-sixth transistor M26 and the twenty-seventh transistor M27, and the thirteenth transistor M13 and the fourteenth transistor M14, so that signals of both the second pull-up node P2 and the first pull-up node P1 are a low level signal outputted by the third voltage terminal V3, and signals of both the second output terminal Gout2 and the first output terminal Gout1 are a low level signal outputted by the fourth voltage terminal V4. In addition, the second pull-down node Q2 controls the thirty-third transistor M33 and the thirty-seventh transistor M37, so that both the first cascade output terminal Gout1' and the second cascade output terminal Gout2' output a low level signal outputted by the third voltage terminal V3.

Alternatively, in the backward scan, the signal of the second signal terminal Vclock2 may be a low level signal, and the signal of the first signal terminal Vclock1 may be a high level signal, which is not specifically limited in the present application.

Figure 4:
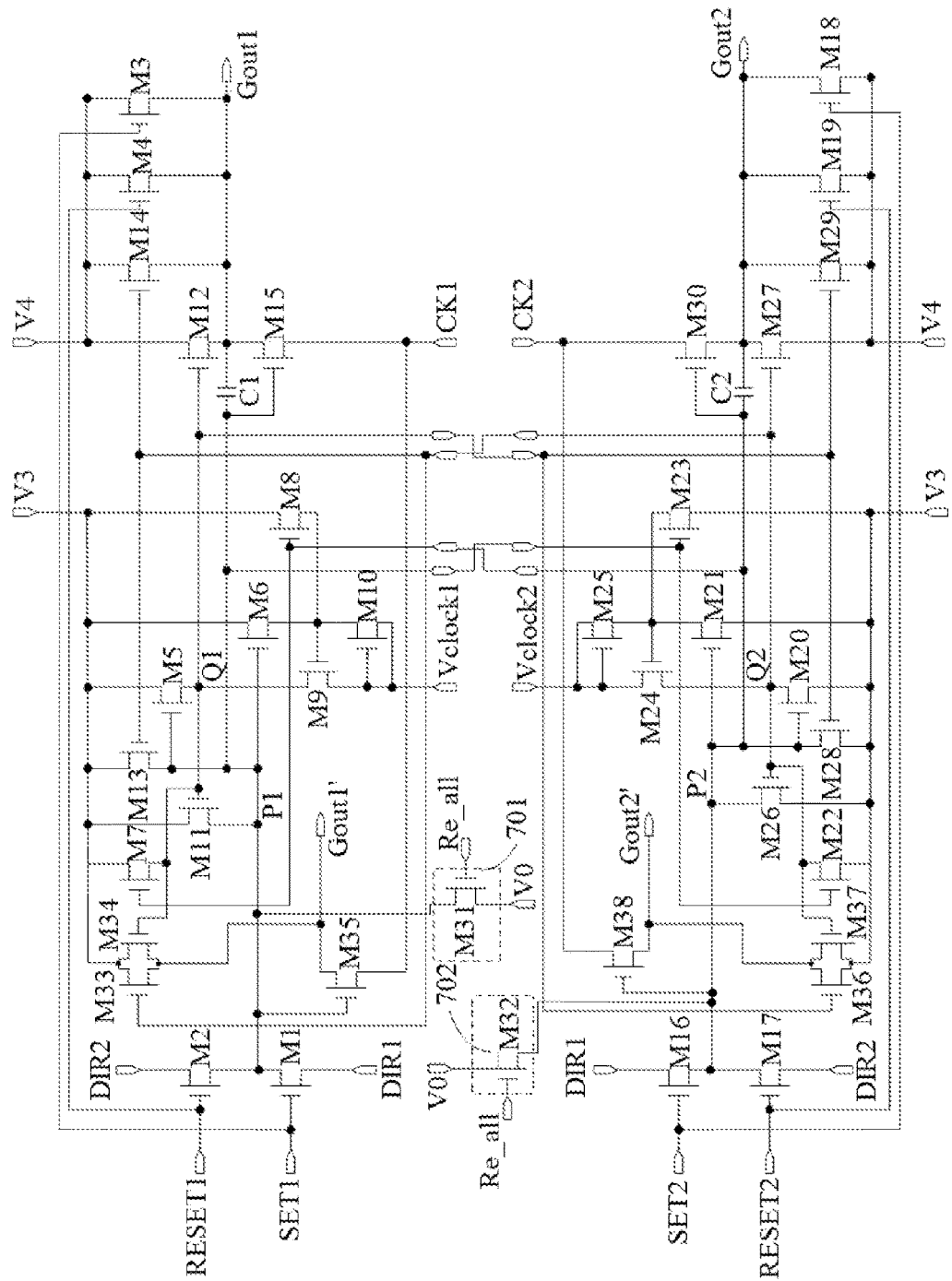
FIG. 4 is a schematic structural diagram of a bi-directional scanning unit according to another embodiment of the invention.

Furthermore, in order to avoid the problem of a power-on disorder, the bi-directional scanning unit according to an embodiment further includes a first initialization module and a second initialization module. The first initialization module and the second initialization module are used to reset a signal of a first pull-up node and a signal of a second pull-up node in the bi-directional scanning unit before scanning. Reference is made to FIG. 4 specifically, which is a schematic structural diagram of a bi-directional scanning unit according to another embodiment. The bi-directional scanning unit further includes a first initialization module 701 connected to the first pull-up node P1 and a second initialization module 702 connected to the second pull-up node P2.

The first initialization module 701 controls, in response to a signal of a restoration control terminal Re_all, a connection state between the first pull-up node P1 and a restoration voltage terminal V0. The second initialization module 702 controls, in response to the signal of the restoration control terminal Re_all, a connection state between the second pull-up node P2 and the restoration voltage terminal V0.

The first initialization module 701 according to the embodiment includes a thirty-first transistor M31.

A gate of the thirty-first transistor M31 is connected to the restoration control terminal Re_all, a first terminal of the thirty-first transistor M31 is connected to the restoration voltage terminal V0, and a second terminal of the thirty-first transistor M31 is connected to the first pull-up node P1.

The second initialization module 702 may have the same composition structure as the first initialization module 701. That is, the second initialization module 702 includes a thirty-second transistor M32.

A gate of the thirty-second transistor M32 is connected to the restoration control terminal Re_all, a first terminal of the thirty-second transistor M32 is connected to the restoration voltage terminal V0, and a second terminal of the thirty-second transistor M32 is connected to the second pull-up node P2.

As to be noted, when the bi-directional scanning unit according to the embodiment is the bi-directional scanning unit according to the embodiment corresponding to the above FIG. 3a and FIG. 3b, the thirty-first transistor M31 and the thirty-second transistor M32 according to the present application may be an N type transistor. Before scanning of the bi-directional scanning unit, a signal of the restoration control terminal Re_all is a high level signal, so as to turn on the thirty-first transistor M31 and the thirty-second M32 and transmit a signal, which is outputted by the restoration voltage terminal V0 of a low level signal, respectively to the first pull-up node P1 and the second pull-up node P2, to reset signals of the first pull-up node P1 and the second pull-up node P2, thereby avoiding the problem of a power-on disorder.

Figure 5:
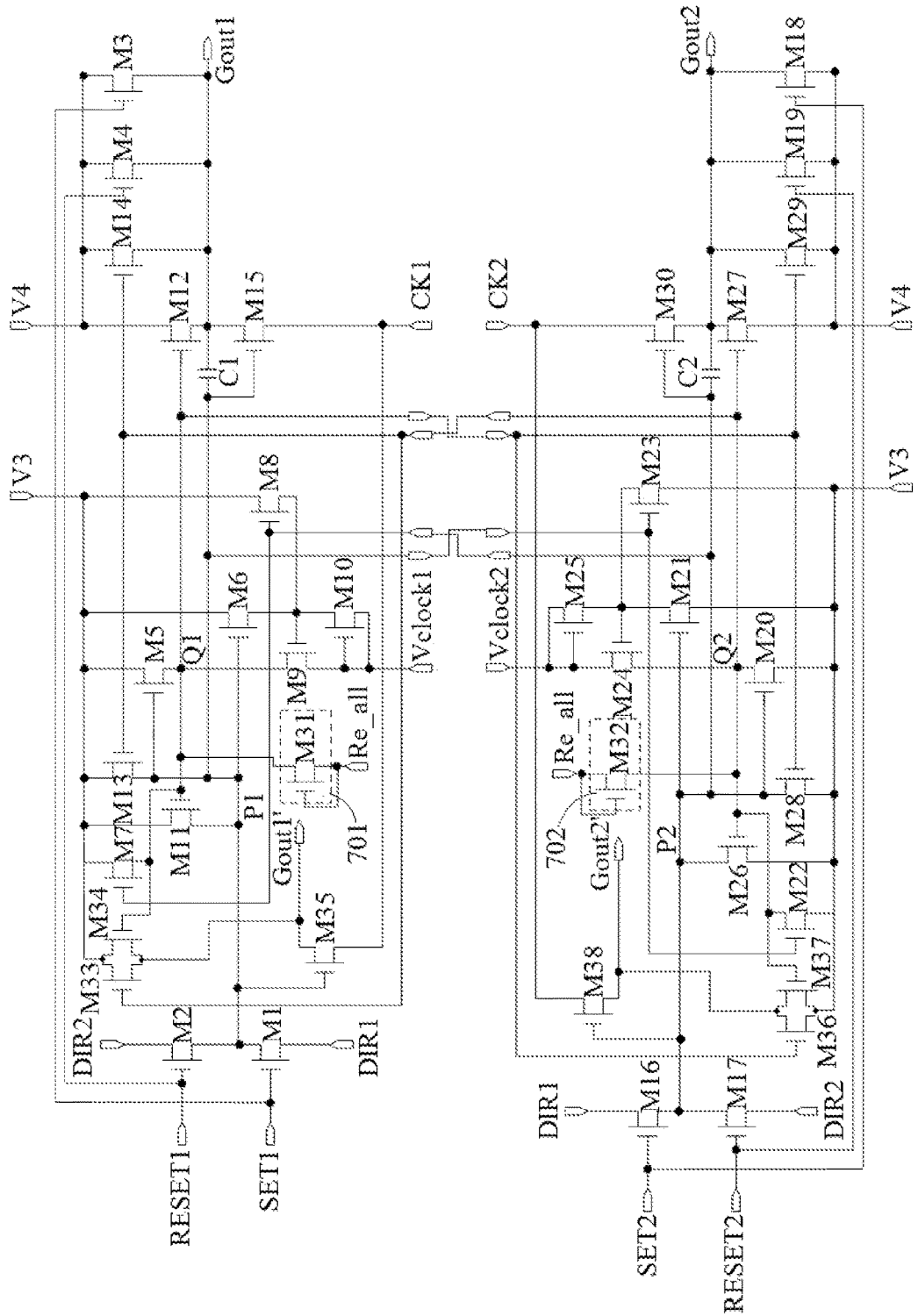
FIG. 5 is a schematic structural diagram of a bi-directional scanning unit according to another embodiment of the invention.

Alternatively, the first initialization module and the second initialization module can also control the potential of a pull-down node to indirectly achieve the resetting of a pull-up node. Reference is made to FIG. 5 specifically, which is a schematic structural diagram of a bi-directional scanning unit according to another embodiment. The bi-directional scanning unit further includes a first initialization module 701 connected to the first pull-down node Q1 and a second initialization module 702 connected to the second pull-down node Q2.

The first initialization module 701 controls, in response to a signal of a restoration control terminal Re_all, a connection state between the first pull-down node Q1 and the restoration control terminal Re_all. The second initialization module 702 controls, in response to the signal of the restoration control terminal Re_all, a connection state between the second pull-down node Q2 and the restoration control terminal Re_all.

The first initialization module 701 according to the embodiment includes a thirty-first transistor M31.

A gate and a first terminal of the thirty-first transistor M31 are both connected to the restoration control terminal Re_all, and a second terminal of the thirty-first transistor M31 is connected to the first pull-down node Q1.

The second initialization module 702 may have the same composition structure as the first initialization module 701. That is, the second initialization module 702 includes a thirty-second transistor M32.

A gate and a first terminal of the thirty-second transistor M32 are both connected to the restoration control terminal Re_all, and a second terminal of the thirty-second transistor M32 is connected to the second pull-down node Q2.

As to be noted, when the bi-directional scanning unit according to the embodiment is the bi-directional scanning unit according to the embodiment corresponding to the above FIG. 3a and FIG. 3b, the thirty-first transistor M31 and the thirty-second transistor M32 according to the present application may be an N type transistor. Before scanning of the bi-directional scanning unit, a signal of the restoration control terminal Re_all is a high level signal, so as to turn the thirty-first transistor M31 and the thirty-second M32 on and transmits a signal, which is outputted by the restoration control terminal Re_all of a high level signal, respectively to the first pull-down node Q1 and the second pull-down node Q2. A connection between the first pull-up node P1 and the third voltage terminal V3 and a connection between the second pull-up node P2 and the third voltage terminal V3 are turned on via a pull-down control module which is respectively connected to the first pull-down node Q1 and the second pull-down node Q2. By means of the signal of the third voltage terminal V3, the first pull-up node P1 and the second pull-up node P2 are reset, thereby avoiding the problem of a power-on disorder.

A gate driving circuit is further provided according to an embodiment. The gate driving circuit includes n stages of bi-directional scanning units, which include a first stage bi-directional scanning unit through an n-th stage bi-directional scanning unit. Each stage of bi-directional scanning unit is the bi-directional scanning unit according to any one of embodiments, where n is an integer not smaller than 2.

Figure 6:
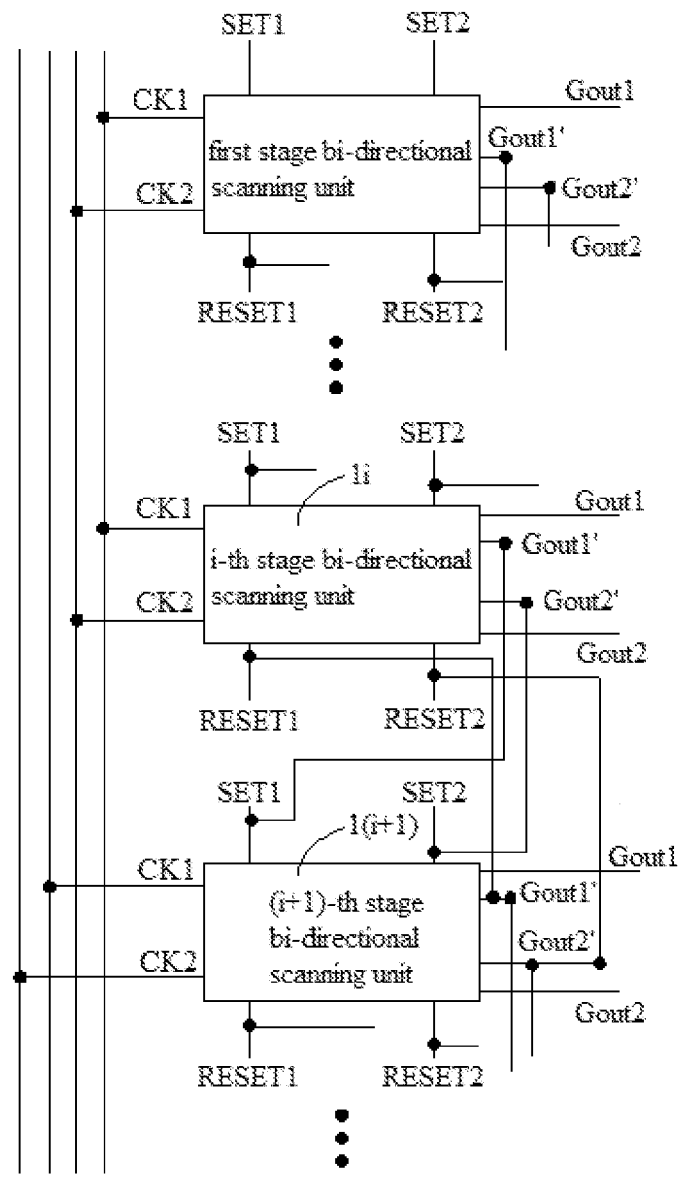
FIG. 6 is a schematic structural diagram of a gate driving circuit according to an embodiment of the invention.

Reference is made to FIG. 6, which is a schematic structural diagram of a gate driving circuit according to an embodiment, where two adjacent stages of bi-directional scanning units are defined as an i-th stage bi-directional scanning unit 1i and an (i+1)-th stage bi-directional scanning unit 1(i+1) respectively, where i is an integer not smaller than n.

A first cascade output terminal Gout1' of the i-th stage bi-directional scanning unit 1i is connected to a first control terminal SET1 of the (i+1)-th stage bi-directional scanning unit 1(i+1), and a first cascade output terminal Gout1' of the (i+1)-th stage bi-directional scanning unit 1(i+1) is connected to a second control terminal RESET1 of the i-th stage bi-directional scanning unit 1i.

A second cascade output terminal Gout2' of the i-th stage bi-directional scanning unit 1i is connected to a third control terminal SET2 of the (i+1)-th stage bi-directional scanning unit 1(i+1), and a second cascade output terminal Gout2' of the (i+1)-th stage bi-directional scanning unit 1(i+1) is connected to a fourth control terminal RESET2 of the i-th stage bi-directional scanning unit 1i.

Odd stages of bi-directional scanning units have a common first clock signal terminal CK1 and a common second clock signal terminal CK2; and even stages of bi-directional scanning units have a common first clock signal terminal CK1 and a common second clock signal terminal CK2.

As to be noted, in the bi-directional scanning unit according to the embodiment, in the forward scanning, both the first control terminal SET1 and the third control terminal SET2 of a first stage bi-directional scanning unit provide initialization control signals via external signal lines. In the backward scanning, both the second control terminal RESET1 and the fourth control terminal RESET2 of the n-th stage bi-directional scanning unit provide initialization control signals via external signal lines. Since each of the output terminals of n cascaded stages of bi-directional scanning units should output a scanning signal stage by stage in the process of scanning, in forward scanning, after a first clock signal terminal of the first stage bi-directional scanning unit outputs a scanning signal, a second signal terminal of the first stage bi-directional scanning unit outputs a scanning signal. Similarly, after a first clock signal terminal of a second stage bi-directional scanning unit outputs a scanning signal, a second signal terminal of the second stage bi-directional scanning unit outputs a scanning signal, and after the second signal terminal of the first stage bi-directional scanning unit outputs a scanning signal, the first signal terminal of the second stage bi-directional scanning unit outputs a scanning signal. In the backward scanning, after a second clock signal terminal of the n-th stage bi-directional scanning unit outputs a scanning signal, a first signal terminal of the n-th stage bi-directional scanning unit outputs a scanning signal. Similarly, after a second clock signal terminal of an (n−1)-th stage bi-directional scanning unit outputs a scanning signal, a first signal terminal of the (n−1)-th stage bi-directional scanning unit outputs a scanning signal, and after the first signal terminal of the n-th stage bi-directional scanning unit outputs a scanning signal, the second signal terminal of the (n−1)-th stage bi-directional scanning unit outputs a scanning signal.

In practical applications, a phase difference of signals outputted by the first clock signal terminal and the second clock signal terminal according to the present application is 180 degree, and a frequency of a signal outputted by the first clock signal terminal is the same as that outputted by the second clock signal terminal. In the forward scanning, the second clock signal terminal outputs the signal which has been delayed by a pre-set time as compared with the first clock signal terminal. In the backward scanning, the first clock signal terminal outputs the signal which has been delayed by a pre-set time as compared with the second clock signal terminal. For cascaded multiple stages of bi-directional scanning unit, in the forward scanning, a first clock signal terminal of a next stage bi-directional scanning unit outputs the signal which has been delayed by a pre-set time as compared with the second clock signal terminal of a previous bi-directional scanning unit. In the backward scanning, the second clock signal terminal of the next stage bi-directional scanning unit outputs the signal which has been delayed by a pre-set time as compared with the first clock signal terminal of the previous bi-directional scanning unit. The pre-set time is not specifically limited in the present application.

A bi-directional scanning unit, a driving method and a gate driving circuit are provided by the embodiments. The bi-directional scanning unit includes a first stage subunit and a second stage subunit. The bi-directional scanning unit can output scanning gate lines stage by stage in a direction from the first stage subunit to the second stage subunit and can also output scanning gate lines stage by stage in a direction from the second stage subunit to the first stage subunit. During the scanning, the first stage subunit and the second stage subunit cooperate with each other, so that one of the stage subunits does not output a scanning signal while the other one outputs a scanning signal. With the technical solutions according to the embodiments, the bi-directional scanning unit can output two-stage scanning signals stage by stage, have a simplified structure due to an interaction between the first stage subunit and the second stage subunit, and satisfy diverse demands on the gate driving circuit.

Based on the above description of the disclosed embodiments, the present disclosure can be implemented or used by a person of skills in the art. Various modifications made to these embodiments may be obvious for persons of skills in the art, and a normal principle defined in the present disclosure may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A bi-directional scanning unit, comprising:
a first stage subunit and a second stage subunit, wherein
the first stage subunit comprises a first input module, a first pull-up node, a first pull-up control module, a second pull-up control module, a first pull-down node, a first pull-down control module, a second pull-down control module, a first pull-down generation module, a first output module, a first output terminal, a first cascade output module and a first cascade output terminal; and
the second stage subunit comprises a second input module, a second pull-up node, a third pull-up control module, a fourth pull-up control module, a second pull-down node, a third pull-down control module, a fourth pull-down control module, a second pull-down generation module, a second output module, a second output terminal, a second cascade output module and a second cascade output terminal; and, wherein
the first input module controls, in response to a signal of a first control terminal, a connection state between a first voltage terminal and the first pull-up node and a connection state between a fourth voltage terminal and the first output terminal, and controls, in response to a signal of a second control terminal, a connection state between a second voltage terminal and the first pull-up node and a connection state between the fourth voltage terminal and the first output terminal, wherein a level of a signal outputted by the first voltage terminal is opposite to that outputted by the second voltage terminal;
the second input module controls, in response to a signal of a third control terminal, a connection state between the first voltage terminal and the second pull-up node and a connection state between the fourth voltage terminal and the second output terminal, or controls, in response to a signal of a fourth control terminal, a connection state between the second voltage terminal and the second pull-up node and a connection state between the fourth voltage terminal and the second output terminal, wherein a structure of the first input module is the same as that of the second input module;
the first pull-up control module controls, in response to a signal of the first pull-up node, a connection state between the first pull-down node and a third voltage terminal and a connection state between the first pull-down node and the first pull-down generation module; and the second pull-up control module controls, in response to a signal of the second pull-up node, a connection state between the first pull-down node and the third voltage terminal and a connection state between the first pull-down node and the first pull-down generation module, wherein an output voltage of the third voltage terminal is lower than that of the fourth voltage terminal;
the third pull-up control module controls, in response to the signal of the second pull-up node, a connection state between the second pull-down node and the third voltage terminal and a connection state between the second pull-down node and the second pull-down generation module; and the fourth pull-up control module controls, in response to the signal of the first pull-up node, a connection state between the second pull-down node and the third voltage terminal and a connection state between the second pull-down node and the second pull-down generation module, wherein a structure of the first pull-up control module is the same as that of the third pull-up control module, and a structure of the second pull-up control module is the same as that of the fourth pull-up control module;
the first pull-down generation module controls, in response to a signal of a first signal terminal, a connection state between the first signal terminal and the first pull-down node;
the second pull-down generation module controls, in response to a signal of a second signal terminal, a connection state between the second signal terminal and the second pull-down node, wherein a structure of the first pull-down generation module is the same as that of the second pull-down generation module;
the first pull-down control module controls, in response to a signal of the first pull-down node, a connection state between the first pull-up node and the third voltage terminal and a connection state between the fourth voltage terminal and the first output terminal; and the second pull-down control module controls, in response to a signal of the second pull-down node, a connection state between the first pull-up node and the third voltage terminal and a connection state between the fourth voltage terminal and the first output terminal;
the third pull-down control module controls, in response to the signal of the second pull-down node, a connection state between the second pull-up node and the third voltage terminal and a connection state between the fourth voltage terminal and the second output terminal; and the fourth pull-down control module controls, in response to the signal of the first pull-down node, a connection state between the second pull-up node and the third voltage terminal and a connection state between the fourth voltage terminal and the second output terminal, wherein a structure of the first pull-down control module is the same as that of the third pull-down control module, and a structure of the second pull-down control module is the same as that of the fourth pull-down control module;
the first output module controls, in response to the signal of the first pull-up node, a connection state between a first clock signal terminal and the first output terminal, and the second output module controls, in response to the signal of the second pull-up node, a connection state between a second clock signal terminal and the second output terminal, wherein a phase difference of signals outputted by the first clock signal terminal and the second clock signal terminal is 180 degree, and a structure of the first output module is the same as that of the second output module;
the first cascade output module controls, in response to the signal of the first pull-down node or the second pull-down node, a connection state between the third voltage terminal and the first cascade output terminal, and controls, in response to the signal of the first pull-up node, a connection state between the first clock signal terminal and the first cascade output terminal; and
the second cascade output module controls, in response to the signal of the second pull-down node or the first pull-down node, a connection state between the third voltage terminal and the second cascade output terminal, and controls, in response to the signal of the second pull-up node, a connection state between the second clock signal terminal and the second cascade output terminal, wherein a structure of the first cascade output module is the same as that of the second cascade output module.

2. The bi-directional scanning unit according to claim 1, wherein the first input module comprises a first transistor, a second transistor, a third transistor and a fourth transistor; and, wherein a gate of the first transistor is connected to the first control terminal, a first terminal of the first transistor is connected to the first voltage terminal, and a second terminal of the first transistor is connected to the first pull-up node; a gate of the second transistor is connected to the second control terminal, a first terminal of the second transistor is connected to the second voltage terminal, and a second terminal of the second transistor is connected to the first pull-up node; a gate of the third transistor is connected to the first control terminal, a first terminal of the third transistor is connected to the fourth voltage terminal, and a second terminal of the third transistor is connected to the first output terminal; and a gate of the fourth transistor is connected to the second control terminal, a first terminal of the fourth transistor is connected to the fourth voltage terminal, and a second terminal of the fourth transistor is connected to the first output terminal;

the second input module comprises a sixteenth transistor, a seventeenth transistor, an eighteenth transistor and a nineteenth transistor; and a gate of the sixteenth transistor is connected to the third control terminal, a first terminal of the sixteenth transistor is connected to the first voltage terminal, and a second terminal of the sixteenth transistor is connected to the second pull-up node; a gate of the seventeenth transistor is connected to the fourth control terminal, a first terminal of the seventeenth transistor is connected to the second voltage terminal, and a second terminal of the seventeenth transistor is connected to the second pull-up node; a gate of the eighteenth transistor is connected to the third control terminal, a first terminal of the eighteenth transistor is connected to the fourth voltage terminal, and a second terminal of the eighteenth transistor is connected to the second output terminal; and a gate of the nineteenth transistor is connected to the fourth control terminal, a first terminal of the nineteenth transistor is connected to the fourth voltage terminal, and a second terminal of the nineteenth transistor is connected to the second output terminal.

3. The bi-directional scanning unit according to claim 1, wherein the first pull-up control module comprises a fifth transistor and a sixth transistor; and, wherein a gate of the fifth transistor is connected to the first pull-up node, a first terminal of the fifth transistor is connected to the third voltage terminal, and a second terminal of the fifth transistor is connected to the first pull-down node; and a gate of the sixth transistor is connected to the first pull-up node, a first terminal of the sixth transistor is connected to the third voltage terminal, and a second terminal of the sixth transistor is connected to the first pull-down generation module; and the third pull-up control module comprises a twentieth transistor and a twenty-first transistor;

a gate of the twentieth transistor is connected to the second pull-up node, a first terminal of the twentieth transistor is connected to the third voltage terminal, and a second terminal of the twentieth transistor is connected to the second pull-down node; and a gate of the twenty-first transistor is connected to the second pull-up node, a first terminal of the twenty-first transistor is connected to the third voltage terminal, and a second terminal of the twenty-first transistor is connected to the second pull-down generation module.

4. The bi-directional scanning unit according to claim 3, wherein the second pull-up control module comprises a seventh transistor and an eighth transistor; and, wherein a gate of the seventh transistor is connected to the second pull-up node, a first terminal of the seventh transistor is connected to the third voltage terminal, and a second terminal of the seventh transistor is connected to the first pull-down node; and a gate of the eighth transistor is connected to the second pull-up node, a first terminal of the eighth transistor is connected to the third voltage terminal, and a second terminal of the eighth transistor is connected to the first pull-down generation module; and the fourth pull-up control module comprises a twenty-second transistor and a twenty-third transistor;

a gate of the twenty-second transistor is connected to the first pull-up node, a first terminal of the twenty-second transistor is connected to the third voltage terminal, and a second terminal of the twenty-second transistor is connected to the second pull-down node;

and a gate of the twenty-third transistor is connected to the first pull-up node, a first terminal of the twenty-third transistor is connected to the third voltage terminal, and a second terminal of the twenty-third transistor is connected to the second pull-down generation module.

5. The bi-directional scanning unit according to claim 4, wherein the first pull-down generation module comprises a ninth transistor and a tenth transistor; and, wherein a gate of the ninth transistor is connected to the second terminal of the sixth transistor and the second terminal of the eighth transistor, a first terminal of the ninth transistor is connected to the first signal terminal, and a second terminal of the ninth transistor is connected to the first pull-down node; and a gate and a first terminal of the tenth transistor are both connected to the first signal terminal, and a second terminal of the tenth transistor is connected to the second terminal of the sixth transistor and the second terminal of the eighth transistor; and the second pull-down generation module comprises a twenty-fourth transistor and a twenty-fifth transistor;

a gate of the twenty-fourth transistor is connected to the second terminal of the twenty-first transistor and the second terminal of the twenty-third transistor, a first terminal of the twenty-fourth transistor is connected to the second signal terminal, and a second terminal of the twenty-fourth transistor is connected to the second pull-down node; and a gate and a first terminal of the twenty-fifth transistor are both connected to the second signal terminal, and a second terminal of the twenty-fifth transistor is connected to the second terminal of the twenty-first transistor and the second terminal of the twenty-third transistor.

6. The bi-directional scanning unit according to claim 5, wherein a width to length ratio of the sixth transistor and that of the eighth transistor each are greater than that of the tenth transistor; and a width to length ratio of the twenty-first transistor and that of the twenty-third transistor each are greater than that of the twenty-fifth transistor.

7. The bi-directional scanning unit according to claim 1, wherein the first pull-down control module comprises an eleventh transistor and a twelfth transistor; and, wherein
- a gate of the eleventh transistor is connected to the first pull-down node, a first terminal of the eleventh transistor is connected to the third voltage terminal, and a second terminal of the eleventh transistor is connected to the first pull-up node; and a gate of the twelfth transistor is connected to the first pull-down node, a first terminal of the twelfth transistor is connected to the fourth voltage terminal, and a second terminal of the twelfth transistor is connected to the first output terminal; and
- the third pull-down control module comprises a twenty-sixth transistor and a twenty-seventh transistor;
- a gate of the twenty-sixth transistor is connected to the second pull-down node, a first terminal of the twenty-sixth transistor is connected to the third voltage terminal, and a second terminal of the twenty-sixth transistor is connected to the second pull-up node; and a gate of the twenty-seventh transistor is connected to the second pull-down node, a first terminal of the twenty-seventh transistor is connected to the fourth voltage terminal, and a second terminal of the twenty-seventh transistor is connected to the second output terminal.

8. The bi-directional scanning unit according to claim 7, wherein the second pull-down control module comprises a thirteenth transistor and a fourteenth transistor; and, wherein
- a gate of the thirteenth transistor is connected to the second pull-down node, a first terminal of the thirteenth transistor is connected to the third voltage terminal, and a second terminal of the thirteenth transistor is connected to the first pull-up node; and a gate of the fourteenth transistor is connected to the second pull-down node, a first terminal of the fourteenth transistor is connected to the fourth voltage terminal, and a second terminal of the fourteenth transistor is connected to the first output terminal; and
- the fourth pull-down control module comprises a twenty-eighth transistor and a twenty-ninth transistor;
- a gate of the twenty-eighth transistor is connected to the first pull-down node, a first terminal of the twenty-eighth transistor is connected to the third voltage terminal, and a second terminal of the twenty-eighth transistor is connected to the second pull-up node; and a gate of the twenty-ninth transistor is connected to the first pull-down node, a first terminal of the twenty-ninth transistor is connected to the fourth voltage terminal, and a second terminal of the twenty-ninth transistor is connected to the second output terminal.

9. The bi-directional scanning unit according to claim 1, wherein the first output module comprises a fifteenth transistor and a first bootstrap capacitor; and, wherein
- a gate of the fifteenth transistor and a first plate of the first bootstrap capacitor are both connected to the first pull-up node, a first terminal of the fifteenth transistor is connected to the first clock signal terminal, and a second terminal of the fifteenth transistor and a second plate of the first bootstrap capacitor are both connected to the first output terminal; and
- the second output module comprises a thirtieth transistor and a second bootstrap capacitor;
- a gate of the thirtieth transistor and a first plate of the second bootstrap capacitor are both connected to the second pull-up node, a first terminal of the thirtieth transistor is connected to the second clock signal terminal, and a second terminal of the thirtieth transistor and a second plate of the second bootstrap capacitor are both connected to the second output terminal.

10. The bi-directional scanning unit according to claim 1, wherein the first cascade output module comprises a thirty-third transistor, a thirty-fourth transistor and a thirty-fifth transistor; and, wherein
- a gate of the thirty-third transistor is connected to the second pull-down node, a first terminal of the thirty-third transistor is connected to the third voltage terminal, and a second terminal of the thirty-third transistor is connected to the first cascade output terminal; a gate of the thirty-fourth transistor is connected to the first pull-down node, a first terminal of the thirty-fourth transistor is connected to the third voltage terminal, and a second terminal of the thirty-fourth transistor is connected to the first cascade output terminal; and a gate of the thirty-fifth transistor is connected to the first pull-up node, a first terminal of the thirty-fifth transistor is connected to the first clock signal terminal, and a second terminal of the thirty-fifth transistor is connected to the first cascade output terminal; and
- the second cascade output module comprises a thirty-sixth transistor, a thirty-seventh transistor and a thirty-eighth transistor;
- a gate of the thirty-sixth transistor is connected to the first pull-down node, a first terminal of the thirty-sixth transistor is connected to the third voltage terminal, and a second terminal of the thirty-sixth transistor is connected to the second cascade output terminal; a gate of the thirty-seventh transistor is connected to the second pull-down node, a first terminal of the thirty-seventh transistor is connected to the third voltage terminal, and a second terminal of the thirty-seventh transistor is connected to the second cascade output terminal; and a gate of the thirty-eighth transistor is connected to the second pull-up node, a first terminal of the thirty-eighth transistor is connected to the second clock signal terminal, and a second terminal of the thirty-eighth transistor is connected to the second cascade output terminal.

11. The bi-directional scanning unit according to claim 1, wherein a level of the signal outputted by the first signal terminal is opposite to that outputted by the second signal terminal, and the signal outputted by the first signal terminal and the signal outputted by the second signal terminal are frame-inversed with respect to each other.

12. The bi-directional scanning unit according to claim 1, further comprising a first initialization module connected to the first pull-up node and a second initialization module connected to the second pull-up node, wherein
- the first initialization module controls, in response to a signal of a restoration control terminal, a connection state between the first pull-up node and a restoration voltage terminal, and the second initialization module controls, in response to the signal of the restoration control terminal, a connection state between the second pull-up node and the restoration voltage terminal.

13. The bi-directional scanning unit according to claim 12, wherein the first initialization module comprises a thirty-first transistor; and, wherein
- a gate of the thirty-first transistor is connected to the restoration control terminal, a first terminal of the thirty-first transistor is connected to the restoration voltage terminal, and a second terminal of the thirty-first transistor is connected to the first pull-up node; and
the second initialization module comprises a thirty-second transistor;
a gate of the thirty-second transistor is connected to the restoration control terminal, a first terminal of the thirty-second transistor is connected to the restoration voltage terminal, and a second terminal of the thirty-second transistor is connected to the second pull-up node.

14. The bi-directional scanning unit according to claim 1, further comprising a first initialization module connected to the first pull-down node and a second initialization module connected to the second pull-down node, wherein
the first initialization module controls, in response to a signal of a restoration control terminal, a connection state between the first pull-down node and the restoration control terminal, and the second initialization module controls, in response to the signal of the restoration control terminal, a connection state between the second pull-down node and the restoration control terminal.

15. The bi-directional scanning unit according to claim 14, wherein the first initialization module comprises a thirty-first transistor; and, wherein
a gate and a first terminal of the thirty-first transistor are both connected to the restoration control terminal, and a second terminal of the thirty-first transistor is connected to the first pull-down node; and
the second initialization module comprises a thirty-second transistor;
a gate and a first terminal of the thirty-second transistor is connected to the restoration control terminal, and a second terminal of the thirty-second transistor is connected to the second pull-down node.

16. A driving method, applied to a bi-directional scanning unit,
wherein the bi-directional scanning unit comprises a first stage subunit and a second stage subunit, wherein
the first stage subunit comprises a first input module, a first pull-up node, a first pull-up control module, a second pull-up control module, a first pull-down node, a first pull-down control module, a second pull-down control module, a first pull-down generation module, a first output module, a first output terminal, a first cascade output module and a first cascade output terminal; and
the second stage subunit comprises a second input module, a second pull-up node, a third pull-up control module, a fourth pull-up control module, a second pull-down node, a third pull-down control module, a fourth pull-down control module, a second pull-down generation module, a second output module, a second output terminal, a second cascade output module and a second cascade output terminal; and, wherein
the first input module controls, in response to a signal of a first control terminal, a connection state between a first voltage terminal and the first pull-up node and a connection state between a fourth voltage terminal and the first output terminal, and controls, in response to a signal of a second control terminal, a connection state between a second voltage terminal and the first pull-up node and a connection state between the fourth voltage terminal and the first output terminal, wherein a level of a signal outputted by the first voltage terminal is opposite to that outputted by the second voltage terminal;
the second input module controls, in response to a signal of a third control terminal, a connection state between the first voltage terminal and the second pull-up node and a connection state between the fourth voltage terminal and the second output terminal, or controls, in response to a signal of a fourth control terminal, a connection state between the second voltage terminal and the second pull-up node and a connection state between the fourth voltage terminal and the second output terminal, wherein a structure of the first input module is the same as that of the second input module;
the first pull-up control module controls, in response to a signal of the first pull-up node, a connection state between the first pull-down node and a third voltage terminal and a connection state between the first pull-down node and the first pull-down generation module; and the second pull-up control module controls, in response to a signal of the second pull-up node, a connection state between the first pull-down node and the third voltage terminal and a connection state between the first pull-down node and the first pull-down generation module, wherein an output voltage of the third voltage terminal is lower than that of the fourth voltage terminal;
the third pull-up control module controls, in response to the signal of the second pull-up node, a connection state between the second pull-down node and the third voltage terminal and a connection state between the second pull-down node and the second pull-down generation module; and the fourth pull-up control module controls, in response to the signal of the first pull-up node, a connection state between the second pull-down node and the third voltage terminal and a connection state between the second pull-down node and the second pull-down generation module, wherein a structure of the first pull-up control module is the same as that of the third pull-up control module, and a structure of the second pull-up control module is the same as that of the fourth pull-up control module;
the first pull-down generation module controls, in response to a signal of a first signal terminal, a connection state between the first signal terminal and the first pull-down node;
the second pull-down generation module controls, in response to a signal of a second signal terminal, a connection state between the second signal terminal and the second pull-down node, wherein a structure of the first pull-down generation module is the same as that of the second pull-down generation module;
the first pull-down control module controls, in response to a signal of the first pull-down node, a connection state between the first pull-up node and the third voltage terminal and a connection state between the fourth voltage terminal and the first output terminal; and the second pull-down control module controls, in response to a signal of the second pull-down node, a connection state between the first pull-up node and the third voltage terminal and a connection state between the fourth voltage terminal and the first output terminal;
the third pull-down control module controls, in response to the signal of the second pull-down node, a connection state between the second pull-up node and the third voltage terminal and a connection state between the fourth voltage terminal and the second output terminal; and the fourth pull-down control module controls, in response to the signal of the first pull-down node, a connection state between the second pull-up node and the third voltage terminal and a connection state between the fourth voltage terminal and the second output terminal, wherein a structure of the first pull-down control module is the same as that of the third pull-down control module, and a structure of the second pull-down control module is the same as that of the fourth pull-down control module;

the first output module controls, in response to the signal of the first pull-up node, a connection state between a first clock signal terminal and the first output terminal, and the second output module controls, in response to the signal of the second pull-up node, a connection state between a second clock signal terminal and the second output terminal, wherein a phase difference of signals outputted by the first clock signal terminal and the second clock signal terminal is 180 degree, and a structure of the first output module is the same as that of the second output module;

the first cascade output module controls, in response to the signal of the first pull-down node or the second pull-down node, a connection state between the third voltage terminal and the first cascade output terminal, and controls, in response to the signal of the first pull-up node, a connection state between the first clock signal terminal and the first cascade output terminal; and the second cascade output module controls, in response to the signal of the second pull-down node or the first pull-down node, a connection state between the third voltage terminal and the second cascade output terminal, and controls, in response to the signal of the second pull-up node, a connection state between the second clock signal terminal and the second cascade output terminal, wherein a structure of the first cascade output module is the same as that of the second cascade output module, wherein the driving method comprises a first stage, a second stage, a third stage and a fourth stage, wherein when scanning in a direction from the first stage subunit to the second stage subunit:

in the first stage, the first input module controls, in response to a signal of the first control terminal, an activation of a connection between the first voltage terminal and the first pull-up node, and an activation of a connection between the fourth voltage terminal and the first output terminal; the first pull-up control module controls, in response to a signal of the first pull-up node, a deactivation of a connection between the first pull-down node and the third voltage terminal, and a deactivation of a connection between the first pull-down node and the first pull-down generation module, and the fourth pull-up control module controls, in response to the signal of the first pull-up node, an activation of a connection between the second pull-down node and the third voltage terminal, and a deactivation of a connection between the second pull-down node and the second pull-down generation module; the first output module controls, in response to the signal of the first pull-up node, an activation of a connection between the first clock signal terminal and the first output terminal; and the first cascade output module controls, in response to the signal of the first pull-up node, an activation of a connection between the first clock signal terminal and the first cascade output terminal;

in the second stage, the first output module controls, in response to the signal of the first pull-up node, an activation of a connection between the first clock signal terminal and the first output terminal, and the first cascade output module controls, in response to the signal of the first pull-up node, an activation of a connection between the first clock signal terminal and the first cascade output terminal, with an output signal of the first clock signal terminal being a scanning signal; the second input module controls, in response to a signal of the third control terminal, an activation of a connection between the first voltage terminal and the second pull-up node, and an activation of a connection between the fourth voltage terminal and the second output terminal; the first pull-up control module controls, in response to the signal of the first pull-up node, an activation of a connection between the first pull-down node and the third voltage terminal, and an activation of a connection between the first pull-down node and the first pull-down generation module; the second pull-up control module controls, in response to a signal of the second pull-up node, a deactivation of a connection between the first pull-down node and the third voltage terminal, and a deactivation of a connection between the first pull-down node and the first pull-down generation module; the third pull-up control module controls, in response to the signal of the second pull-up node, an activation of a connection between the second pull-down node and the third voltage terminal, and a deactivation of a connection between the second pull-down node and the second pull-down generation module; the fourth pull-up control module controls, in response to the signal of the first pull-up node, an activation of a connection between the second pull-down node and the third voltage terminal, and a deactivation of a connection between the second pull-down node and the second pull-down generation module; the second output module controls, in response to the signal of the second pull-up node, an activation of a connection between the second clock signal terminal and the second output terminal; and the second cascade output module controls, in response to the signal of the second pull-up node, an activation of a connection between the second clock signal terminal and the second cascade output terminal;

in the third stage, the second output module controls, in response to the signal of the second pull-up node, an activation of a connection between the second clock signal terminal and the second output terminal, and the second cascade output module controls, in response to the signal of the second pull-up node, an activation of a connection between the second clock signal terminal and the second cascade output terminal, with an output signal of the second clock signal terminal being the scanning signal; the first input module controls, in response to a signal of the second control terminal, an activation of a connection between the second voltage terminal and the first pull-up node, and an activation of a connection between the fourth voltage terminal and the first output terminal; the third pull-up control module controls, in response to the signal of the second pull-up node, an activation of a connection between the second pull-down node and the third voltage terminal, and a deactivation of a connection between the second pull-down node and the second pull-down generation module; and the second pull-up control module controls, in response to the signal of the second pull-up node, an activation of a connection between the first pull-down node and the third voltage terminal, and a deactivation of a connection between the first pull-down node and the first pull-down generation module; and in the fourth stage, the second input module controls, in response to a signal of the fourth control terminal, an activation of a connection between the second voltage terminal and the second pull-up node, and an activation of a connection between the fourth voltage terminal and the second output terminal, wherein the first pull-down generation module controls, in response to a signal of the first signal terminal, an activation of a connection between the first signal terminal and the first pull-down node; the first pull-down control module controls, in response to a signal of the first pull-down node, an activation of a connection between the first pull-up node and the third voltage terminal, and an activation of a connection between the fourth voltage terminal and the first output terminal; the fourth pull-down control module controls, in response to the signal of the first pull-down node, an activation of a connection between the second pull-up node and the third voltage terminal, and an activation of a connection between the fourth voltage terminal and the second output terminal; the first cascade output module controls, in response to the signal of the first pull-down node, an activation of a connection between the third voltage terminal and the first cascade output terminal, and the second cascade output module controls, in response to the signal of the first pull-down node, an activation of a connection between the third voltage terminal and the second cascade output terminal; or wherein the second pull-down generation module controls, in response to a signal of the second signal terminal, an activation of a connection between the second signal terminal and the second pull-down node; the third pull-down control module controls, in response to a signal of the second pull-down node, an activation of a connection between the second pull-up node and the third voltage terminal, and an activation of a connection between the fourth voltage terminal and the second output terminal; the second pull-down control module controls, in response to the signal of the second pull-down node, an activation of a connection between the first pull-up node and the third voltage terminal, and an activation of a connection between the fourth voltage terminal and the first output terminal; and the first cascade output module controls, in response to the signal of the second pull-down node, an activation of a connection between the third voltage terminal and the first cascade output terminal, and the second cascade output module controls, in response to the signal of the second pull-down node, an activation of a connection between the third voltage terminal and the second cascade output terminal;

or when scanning in a direction from the second stage subunit to the first stage subunit:

in the first stage, the second input module controls, in response to a signal of the fourth control terminal, an activation of a connection between the second voltage terminal and the second pull-up node, and an activation of a connection between the fourth voltage terminal and the second output terminal; the third pull-up control module controls, in response to a signal of the second pull-up node, an activation of a connection between the second pull-down node and the third voltage terminal, and an activation of a connection between the second pull-down node and the second pull-down generation module; the second pull-up control module controls, in response to the signal of the second pull-up node, an activation of a connection between the first pull-down node and the third voltage terminal, and an activation of a connection between the first pull-down node and the first pull-down generation module; the second output module controls, in response to the signal of the second pull-up node, an activation of a connection between the second clock signal terminal and the second output terminal; and the second cascade output module controls, in response to the signal of the second pull-up node, an activation of a connection between the second clock signal terminal and the second cascade output terminal;

in the second stage, the second output module controls, in response to the signal of the second pull-up node, an activation of a connection between the second clock signal terminal and the second output terminal, and the second cascade output module controls, in response to the signal of the second pull-up node, an activation of a connection between the second clock signal terminal and the second cascade output terminal, with an output signal of the second clock signal terminal being a scanning signal; the first input module controls, in response to a signal of the second control terminal, an activation of a connection between the second voltage terminal and the first pull-up node, and an activation of a connection between the fourth voltage terminal and the first output terminal; the third pull-up control module controls, in response to the signal of the second pull-up node, an activation of a connection between the second pull-down node and the third voltage terminal, and an activation of a connection between the second pull-down node and the second pull-down generation module; and the second pull-up control module controls, in response to the signal of the second pull-up node, an activation of a connection between the first pull-down node and the third voltage terminal, and an activation of a connection between the first pull-down node and the first pull-down generation module; the second output module controls, in response to the signal of the second pull-up node, an activation of a connection between the second clock signal terminal and the second output terminal; the first pull-up control module controls, in response to a signal of the first pull-up node, an activation of a connection between the first pull-down node and the third voltage terminal, and a deactivation of a connection between the first pull-down node and the first pull-down generation module; the fourth pull-up control module controls, in response to the signal of the first pull-up node, an activation of a connection between the second pull-down node and the third voltage terminal, and a deactivation of a connection between the second pull-down node and the second pull-down generation module; the first output module controls, in response to the signal of the first pull-up node, an activation of a connection between the first clock signal terminal and the first output terminal; and the first cascade output module controls, in response to the signal of the first pull-up node, an activation of a connection between the first clock signal terminal and the first cascade output terminal;

in the third stage, the first output module controls, in response to the signal of the first pull-up node, an activation of a connection between the first clock signal terminal and the first output terminal, the first cascade output module controls, in response to the signal of the first pull-up node, an activation of a connection between the first clock signal terminal and the first cascade output terminal, with the output signal of the first clock signal terminal being the scanning signal; and the second input module controls, in response to a signal of the third control terminal, an activation of a connection between the first voltage terminal and the second pull-up node, and an activation of a connection between the fourth voltage terminal and the second output terminal; the first pull-up control module controls, in response to the signal of the first pull-up node, an activation of a connection between the first pull-down node and the third voltage terminal, and a deactivation of a connection between the first pull-down node and the first pull-down generation module; and the fourth pull-up control module controls, in response to the signal of the first pull-up node, an activation of a connection between the second pull-down node and the third voltage terminal, and a deactivation of a connection between the second pull-down node and the second pull-down generation module; and in the fourth stage, the first input module controls, in response to a signal of the first control terminal, an activation of a connection between the first voltage terminal and the first pull-up node, and an activation of a connection between the fourth voltage terminal and the first output terminal, wherein the first pull-down generation module controls, in response to a signal of the first signal terminal, an activation of a connection between the first signal terminal and the first pull-down node; and the first pull-down control module controls, in response to a signal of the first pull-down node, an activation of a connection between the first pull-up node and the third voltage terminal, and an activation of a connection between the fourth voltage terminal and the first output terminal; the fourth pull-down control module controls, in response to the signal of the first pull-down node, an activation of a connection between the second pull-up node and the third voltage terminal, and an activation of a connection between the fourth voltage terminal and the second output terminal; the first cascade output module controls, in response to the signal of the first pull-down node, an activation of a connection between the third voltage terminal and the first cascade output terminal, and the second cascade output module controls, in response to the signal of the first pull-down node, an activation of a connection between the third voltage terminal and the second cascade output terminal; or wherein the second pull-down generation module controls, in response to a signal of the second signal terminal, an activation of a connection between the second signal terminal and the second pull-down node; and the third pull-down control module controls, in response to a signal of the second pull-down node, an activation of a connection between the second pull-up node and the third voltage terminal, and an activation of a connection between the fourth voltage terminal and the second output terminal; the second pull-down control module controls, in response to the signal of the second pull-down node, an activation of a connection between the first pull-up node and the third voltage terminal, and an activation of a connection between the fourth voltage terminal and the first output terminal; and the first cascade output module controls, in response to the signal of the second pull-down node, an activation of a connection between the third voltage terminal and the first cascade output terminal, and the second cascade output module controls, in response to the signal of the second pull-down node, an activation of a connection between the third voltage terminal and the second cascade output terminal.

17. A gate driving circuit, comprising n stages of bi-directional scanning units, which comprise a first stage bi-directional scanning unit through an n-th stage bi-directional scanning unit, wherein each stage of bi-directional scanning unit is the bi-directional scanning unit according to claim 1, where n is an integer not smaller than 2.

18. The gate driving circuit according to claim 17, wherein two adjacent stages of bi-directional scanning units are defined as an i-th stage bi-directional scanning unit and an (i+1)-th stage bi-directional scanning unit respectively, where i is an integer not smaller than n;
- a first cascade output terminal of the i-th stage bi-directional scanning unit is connected to a first control terminal of the (i+1)-th stage bi-directional scanning unit, and a first cascade output terminal of the (i+1)-th stage bi-directional scanning unit is connected to a second control terminal of the i-th stage bi-directional scanning unit;
- a second cascade output terminal of the i-th stage bi-directional scanning unit is connected to a third control terminal of the (i+1)-th stage bi-directional scanning unit, and a second cascade output terminal of the (i+1)-th stage bi-directional scanning unit is connected to a fourth control terminal of the i-th stage bi-directional scanning unit; and
- odd stages of bi-directional scanning units have a common first clock signal terminal and a common second clock signal terminal, and even stages of bi-directional scanning units have a common first clock signal terminal and a common second clock signal terminal.

* * * * *